(12) United States Patent
Tsuyutani et al.

(10) Patent No.: US 11,053,118 B2
(45) Date of Patent: Jul. 6, 2021

(54) SENSOR PACKAGE SUBSTRATE AND SENSOR MODULE HAVING THE SAME

(71) Applicant: TDK CORPORATION, Tokyo (JP)

(72) Inventors: Kazutoshi Tsuyutani, Tokyo (JP); Yoshihiro Suzuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 38 days.

(21) Appl. No.: 16/587,794

(22) Filed: Sep. 30, 2019

(65) Prior Publication Data
US 2020/0109047 A1   Apr. 9, 2020

(30) Foreign Application Priority Data

Oct. 3, 2018 (JP) .............................. JP2018-188045

(51) Int. Cl.
| | |
|---|---|
| *H01L 23/00* | (2006.01) |
| *B81C 1/00* | (2006.01) |
| *B81B 7/02* | (2006.01) |
| *H04R 19/04* | (2006.01) |
| *H04R 19/00* | (2006.01) |

(52) U.S. Cl.
CPC .............. *B81C 1/0023* (2013.01); *B81B 7/02* (2013.01); *H01L 24/48* (2013.01); *H04R 19/005* (2013.01); *H04R 19/04* (2013.01); *B81B 2201/0257* (2013.01); *H01L 2224/48091* (2013.01); *H01L 2224/73265* (2013.01); *H01L 2924/1461* (2013.01); *H04R 2201/003* (2013.01)

(58) Field of Classification Search
None
See application file for complete search history.

(56) References Cited

U.S. PATENT DOCUMENTS

2012/0018820 A1   1/2012   Utsumi et al.

FOREIGN PATENT DOCUMENTS

| JP | 2010-245645 A | 10/2010 | |
|---|---|---|---|
| JP | 2010-268412 A | 11/2010 | |
| WO | WO-2014135035 A1 * | 9/2014 | .......... H04M 1/0249 |

* cited by examiner

*Primary Examiner* — Robert K Carpenter
(74) *Attorney, Agent, or Firm* — McDermott Will & Emery LLP

(57) ABSTRACT

Disclosed herein is a sensor package substrate that includes a first mounting area for mounting a sensor chip. The sensor package substrate has a through hole formed at a position overlapping the first mounting area in a plan view so as to penetrate the sensor package substrate from one surface to the other surface. The through hole includes a first section having a first diameter and a second section having a second diameter smaller than the first diameter. A step part inside the through hole positioned at a boundary between the first and second sections constitutes a second mounting area for mounting an anti-dust filter.

18 Claims, 26 Drawing Sheets

SENSOR PACKAGE SUBSTRATE AND SENSOR MODULE HAVING THE SAME

CROSS-REFERENCE TO RELATED APPLICATIONS

The disclosure of Japanese Patent Application No. 2018-188045 filed on Oct. 3, 2018 including the specification, drawings and abstract is incorporated herein by reference in its entirety.

BACKGROUND OF THE INVENTION

Field of the Invention

The present invention relates to a sensor package substrate and a sensor module having the same and, more particularly, to a sensor package substrate for mounting a sensor that detects air vibration, air pressure, air temperature, or air composition and a sensor module having the same.

Description of Related Art

As a sensor module having a sensor chip such as a microphone, sensor modules described in JP 2010-268412 A and JP 2010-245645 A are known. The sensor modules described in JP 2010-268412 A and JP 2010-245645 A have a substrate having a through hole and a sensor chip mounted on the substrate so as to overlap the through hole, and the sensor chip detects vibration (sound) of air entering through the through hole.

The through hole formed in the substrate may serve as an intrusion path for foreign matters such as dirt and dust. To cope with this, JP 2010-268412 describes in FIG. 17 a configuration to prevent mixture of foreign matter by disposing a porous film inside the through hole.

However, it is not easy to stably fix an anti-dust filter such as a porous film inside the through hole and, when the anti-dust filter is fixed by simply using an adhesive, not only is it difficult to control the attachment position of the filter, but also the filter may fall off from the through hole.

SUMMARY

It is therefore an object of the present invention to provide a sensor package substrate having a through hole capable of stably holding an anti-dust filter inside the through hole and a sensor module having such a sensor package substrate.

A sensor package substrate according to the present invention includes: a first mounting area for mounting a sensor chip; and a through hole formed at a position overlapping the first mounting area in a plan view so as to penetrate the sensor package substrate from one surface to the other surface. The through hole includes a first section having a first diameter and a second section having a second diameter smaller than the first diameter. A step part inside the through hole positioned at the boundary between the first and second sections constitutes a second mounting area for mounting an anti-dust filter.

Further, a sensor module according to the present invention includes the above sensor package substrate, a sensor chip mounted in the first mounting area, and an anti-dust filter mounted in the second mounting area.

According to the present invention, the step part is formed inside the through hole, whereby the anti-dust filter can be mounted at the step part. Thus, the anti-dust filter can be positioned by the step part and prevented from falling off, thereby making it possible to stably dispose the anti-dust filter inside the through hole.

In the present invention, the first section of the through hole may be opened to the one surface, and the first mounting area is positioned on the one surface side. With this configuration, it is possible to sufficiently ensure the diameter of the through hole at a portion facing the sensor chip. In this case, the second section of the through hole may be opened to the other surface. This makes the shape of the through hole comparatively simple, allowing the through hole to be formed without using a complicated process.

In the present invention, at least one of the first and second sections of the through hole may have a tapered shape in which the diameter thereof is continuously changed in the depth direction. Thus, it is possible to adjust, e.g., detection characteristics of the sensor chip by the tapered shape.

In the present invention, the first section of the through hole may be opened to the other surface, and the first mounting area may be positioned on the one surface side. With this configuration, it is possible to sufficiently ensure the diameter of the through hole on the other surface side, whereby, for example, sound collection characteristics can be enhanced.

In the present invention, the through hole may further include a third section having a third diameter larger than the second diameter, and the second section may be positioned between the first and second sections. Thus, it is possible to increase the opening area of the through hole on the one surface and the other surface sides while providing the step part inside the through hole. In this case, the step part inside the through hole positioned at the boundary between the second and third sections may constitute the first mounting area. This allows both the anti-dust filter and the sensor chip to be disposed inside the through hole.

In the present invention, the through hole may further include a third section having a third diameter larger than the first diameter, the first section may be positioned between the second and third sections, and the step part inside the through hole positioned at the boundary between the first and third sections may constitute the first mounting area. This also allows both the anti-dust filter and the sensor chip to be disposed inside the through hole.

The sensor package substrate according to the present invention may further include an electronic component connected to the sensor chip, and the first mounting area and the electronic component may overlap each other in a plan view. Thus, the sensor chip and the electronic component are laid out so as to overlap each other, so that when the thickness of an insulating layer interposed between the sensor chip and the electronic component is reduced, it is possible not only to shorten the length of a wiring connecting the sensor chip and the electronic component, but also to reduce the area of the substrate.

In the present invention, the sensor chip may be a sensor that detects air vibration, air pressure, air temperature or air composition. This makes it possible to detect air vibration, air pressure, air temperature or air composition through the through hole.

As described above, according to the present invention, there can be provided a sensor package substrate capable of stably holding the anti-dust filter inside the through hole and a sensor module having such a sensor package substrate.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Figure 1:
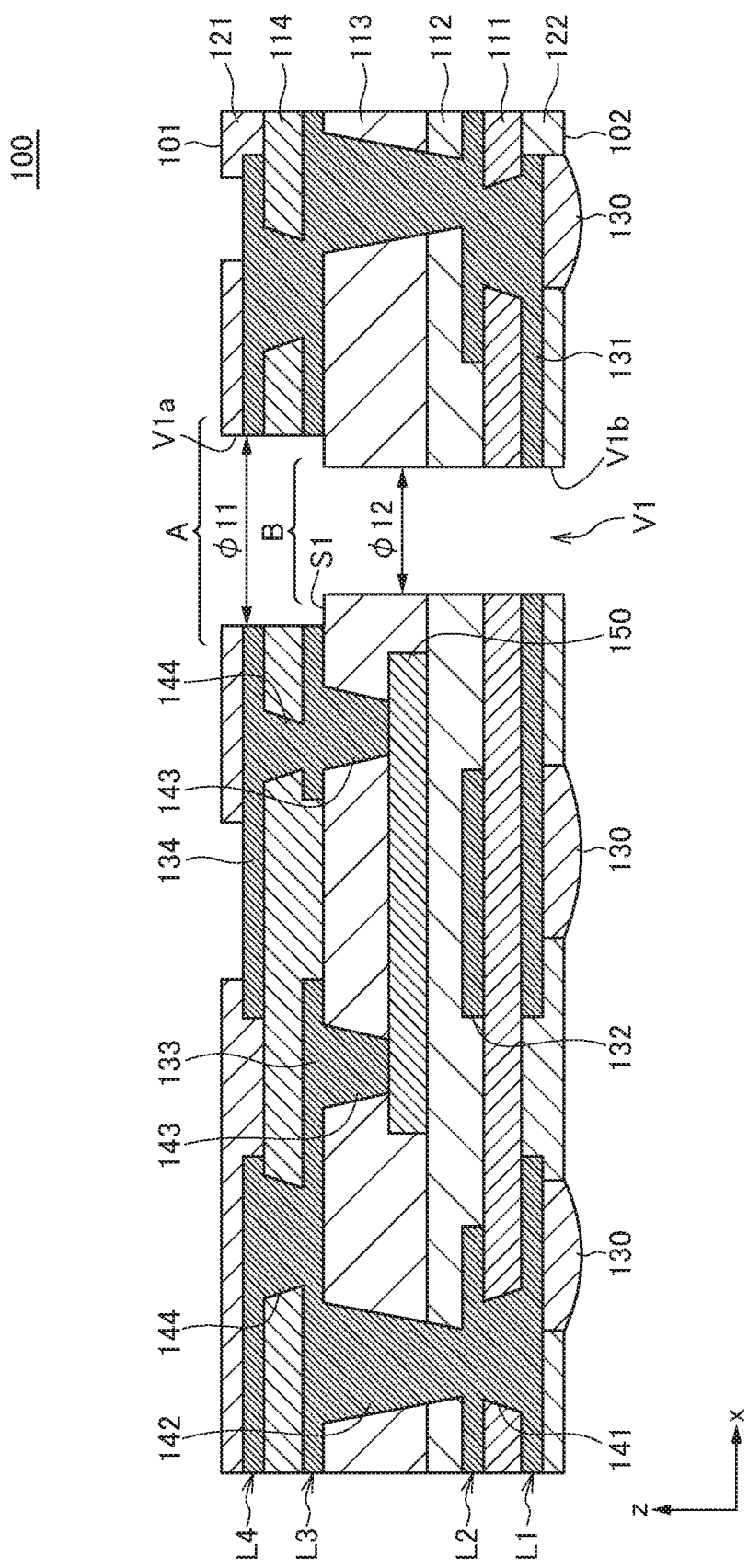
FIG. 1 is a schematic cross-sectional view for explaining the structure of a sensor package substrate according to one embodiment of the present invention.

Hereinafter, preferred embodiments of the present invention will be described in detail with reference to the accompanying drawings. Positional relationships such as upper, lower, left, and right will be based on those in the drawings unless otherwise noted. Further, the dimensional proportions in the drawings are not limited to those illustrated in the drawings. The following embodiments are merely illustrative purposes only, and the invention is not limited to the following embodiments. Further, the present invention can be variously modified without departing from the gist of the invention.

FIG. 1 is a schematic cross-sectional view for explaining the structure of a sensor package substrate 100 according to one embodiment of the present invention.

As illustrated in FIG. 1, the sensor package substrate 100 according to the present embodiment includes four insulating layers 111 to 114 and wiring layers L1 to L4 positioned on the surfaces of the insulating layers 111 to 114. Although not particularly limited, the insulating layer 111 positioned in the lowermost layer and the insulating layer 114 positioned in the uppermost layer may each be a core layer obtained by impregnating a core material such as glass fiber with a resin material such as glass epoxy. On the other hand, the insulating layers 112 and 113 may each be made of a resin material not containing a core material such as glass cloth. Particularly, the thermal expansion coefficient of the insulating layers 111 and 114 is preferably smaller than that of the insulating layers 112 and 113.

The insulating layer 114 positioned in the uppermost layer and the wiring layer L4 formed on the surface of the insulating layer 114 are partially covered by a solder resist 121. On the other hand, the insulating layer 111 positioned in the lowermost layer and the wiring layer L1 formed on the surface of the insulating layer 111 are partially covered by a solder resist 122. The solder resist 121 constitutes one surface 101 of the sensor package substrate 100, and the solder resist 122 constitutes the other surface 102 of the sensor package substrate 100.

The wiring layers L1 to L4 have wiring patterns 131 to 134, respectively. An external terminal 130 is formed at a part of the wiring pattern 131 that is not covered with the solder resist 122. The external terminal 130 serves as a connection terminal to a motherboard to be described later. Apart of the wiring pattern 134 that is not covered with the solder resist 121 is used as a bonding pad. The wiring patterns 131 to 134 are mutually connected through conductors 141 to 144 penetrating the insulating layers 111 to 114.

In the present embodiment, amounting area A for a sensor chip is provided on the one surface 101 of the sensor package substrate 100. Further, a through hole V1 penetrating the sensor package substrate 100 from the one surface 101 to the other surface 102 is formed at a position overlapping the mounting area A in a plan view. The through hole V1 is not closed but opened to both the one surface 101 and the other surface 102, allowing air to circulate through the through hole V1.

The through hole V1 has a first section V1a opened to the one surface 101 and a second section V1b opened to the other surface 102. A diameter φ11 of the first section V1a is larger than a diameter φ12 of the second section V1b. In the present embodiment, the center axes of the first and second sections V1a and V1b substantially coincide with each other, so that a step part S1 is formed at the boundary between the first and second sections V1a and V1b. The step part S1 is used as a mounting area B for an anti-dust filter to be described later.

The sensor package substrate 100 according to the present embodiment has a controller chip 150 which is embedded between the insulating layers 112 and 113. The controller chip 150 is an electronic component connected to a sensor chip mounted in the mounting area A. As a matter of course, the controller chip 150 is disposed so as to avoid the through hole V1. However, the controller chip 150 and the mounting area A may partially overlap each other in a plan view. In the present invention, the electronic component such as the controller chip 150 is not particularly limited in type and may be a digital IC having a very high operating frequency (MEMS (Micro Electro Mechanical Systems), a CPU (Central Processing Unit), a DSP (Digital Signal Processor), a GPU (Graphics processing Unit), an ASIC (Application Specific Integrated Circuit), etc.) a memory-based IC (an F-Rom, an SDRAM, etc.), an active element such as an analog IC (an amplifier, an antenna switch, a high-frequency oscillation circuit, etc.) or a passive element (a varistor, a resistor, a capacitor, etc.).

In the present specification, the "sensor package substrate" does not indicate only an individual substrate (individual piece, individual product) that is a unit substrate incorporating therein or mounting thereon electronic components, but may refer to an aggregate substrate (work board, work sheet) that includes a plurality of the individual substrates.

Figure 2:
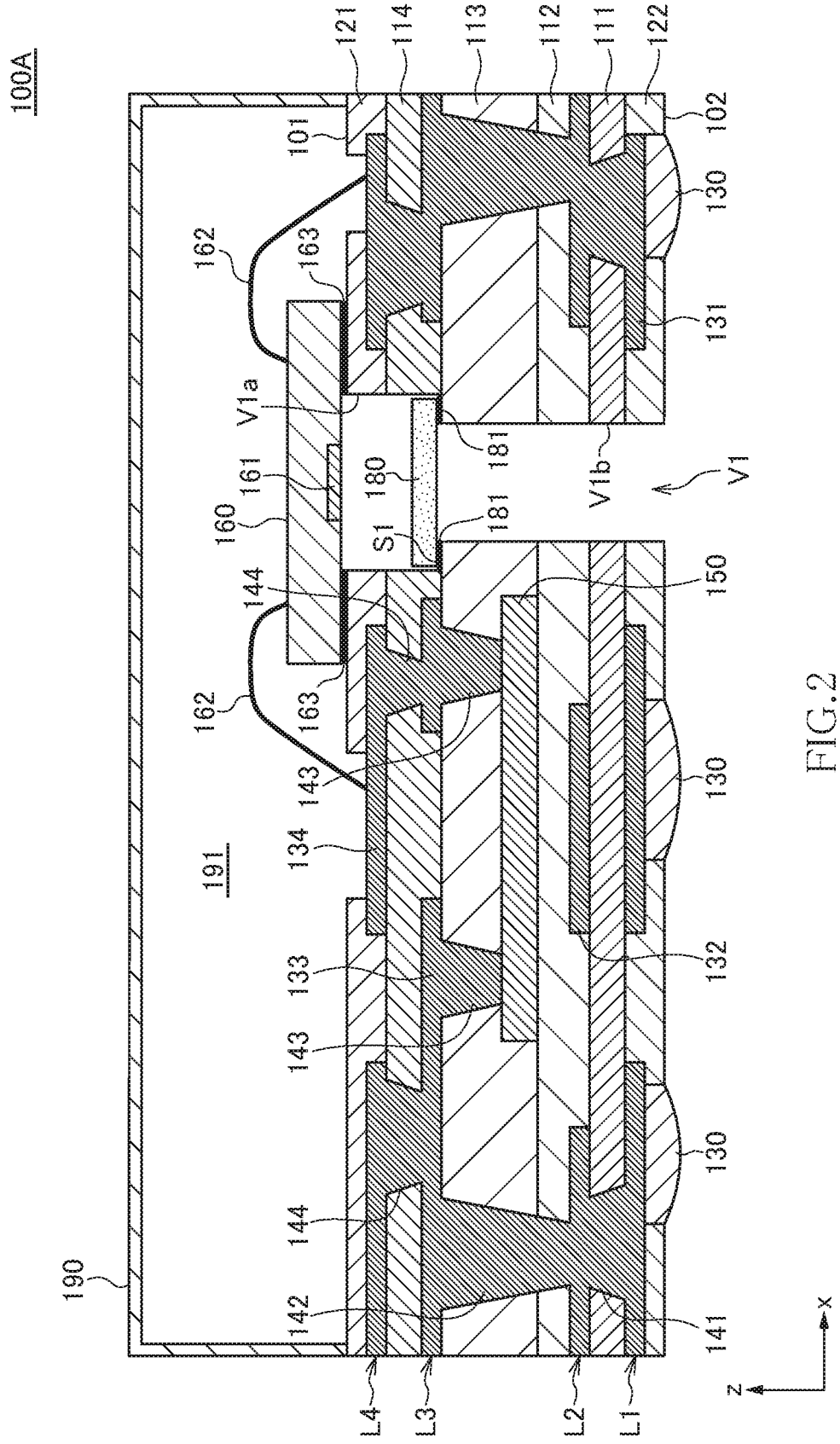
FIG. 2 is a schematic cross-sectional view for explaining the structure of a sensor module according to afirst embodiment of the present invention.
Figure 3:
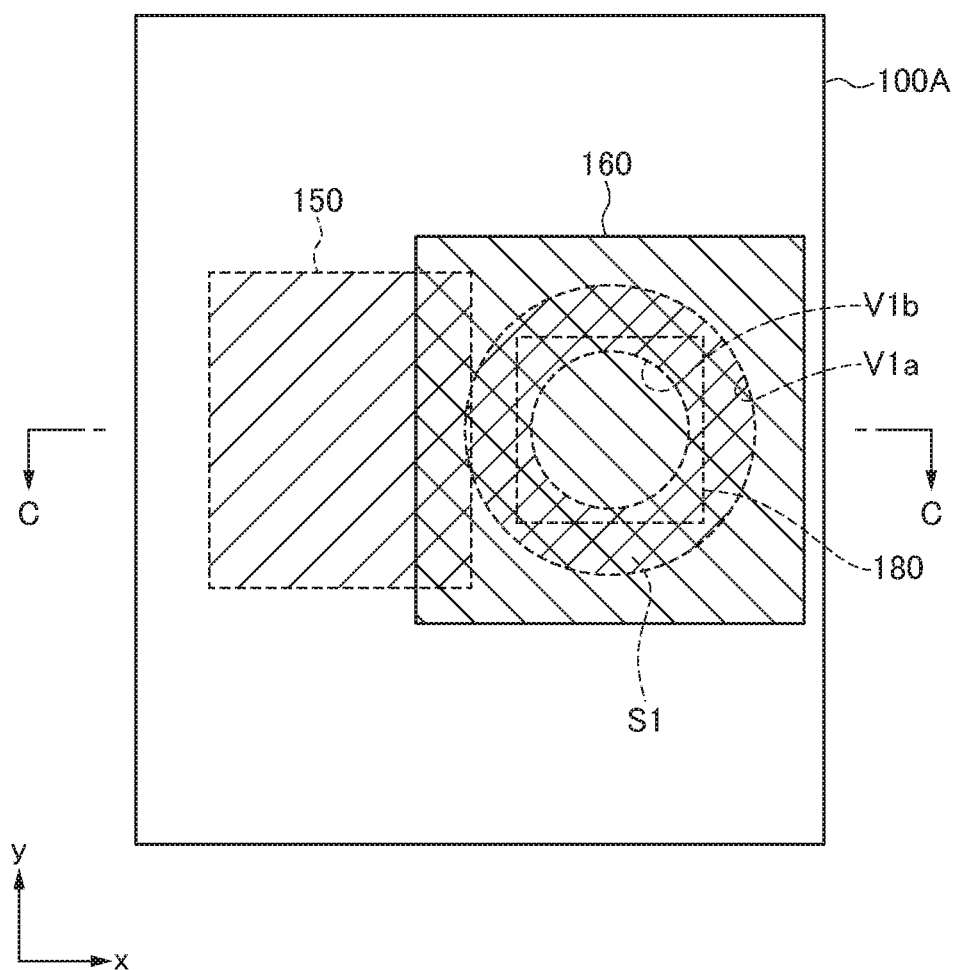
FIG. 3 is a schematic plan view of the sensor module according to the first embodiment of the present invention.

FIG. 2 is a schematic cross-sectional view for explaining the structure of a sensor module 100A according to a first embodiment using the sensor package substrate 100. FIG. 3 is a schematic plan view of the sensor module 100A according to the first embodiment. The cross section illustrated in FIG. 2 is a cross section taken along line C-C in FIG. 3.

As illustrated in FIGS. 2 and 3, in the sensor module 100A according to the first embodiment, a sensor chip 160 is mounted in the mounting area A of the sensor package substrate 100, and an anti-dust filter 180 is mounted in the mounting area B.

The sensor chip 160 is a sensor for detecting, e.g., air vibration, air pressure, air temperature or air composition, i.e., a microphone, a pressure sensor, a temperature sensor, a gas sensor, or the like. A detection part 161 of the sensor chip 160 is provided at a position facing the through hole V1 formed in the sensor package substrate 100. When the sensor chip 160 is, e.g., a microphone, the detection part 161 includes a vibration plate having a membrane structure. Although the position of the detection part 161 in the sensor chip 160 is not particularly limited, at least a part of the detection part 161 is exposed to the through hole V1. Thus, the detection part 161 of the sensor chip 160 is exposed to atmosphere through the through hole V1 and can thus detect air vibration, air pressure, air temperature or air composition. An output signal from the detection part 161 is connected to the wiring pattern 134 through a bonding wire 162. However, the method for connecting the sensor package substrate 100 and the sensor chip 160 is not limited to this, but flip-chip connection may be used. In the example illustrated in FIG. 2, the sensor chip 160 is attached to the surface 101 of the sensor package substrate 100 by a die attach film 163. Further, as illustrated in FIG. 3, the sensor chip 160 overlaps the controller chip 150 in a plan view.

The anti-dust filter 180 is made of a porous material such as PTFE (polytetrafluoroethylene) and is fixed to the step part S1 positioned at the boundary between the first and second sections V1a and V1b. Thus, even when foreign matters such as dirt or dust is mixed into the air passing through the through hole V1, the foreign matters do not reach the sensor chip 160 but are removed by the anti-dust filter 180. In addition, since the anti-dust filter 180 is fixed to the step part S1 formed inside the through hole V1, the depth position of the anti-dust filter 180 inside the through hole V1 is defined by the step part S1, and the anti-dust filter 180 is fixed more securely inside the through hole V1, thus preventing the anti-dust filter 180 from falling off from the through hole V1.

The surface 101 of the sensor package substrate 100 is covered with a cap 190. The cap 190 plays a role of protecting the sensor chip 160 and enhancing detection characteristics of the sensor chip 160. Particularly, when the sensor chip 160 is a microphone, the volume of a space 191 formed by the cap 190 has a great influence on acoustic characteristics. When the anti-dust filter 180 and the sensor chip 160 are mounted on the surface 101 of the sensor package substrate 100 in an overlapping manner, the volume of the space 191 formed by the cap 190 is reduced to degrade the acoustic characteristics, while, in the present embodiment, the anti-dust filter 180 is disposed inside the through hole V1, so that the volume of the space 191 can be increased.

Figure 4:
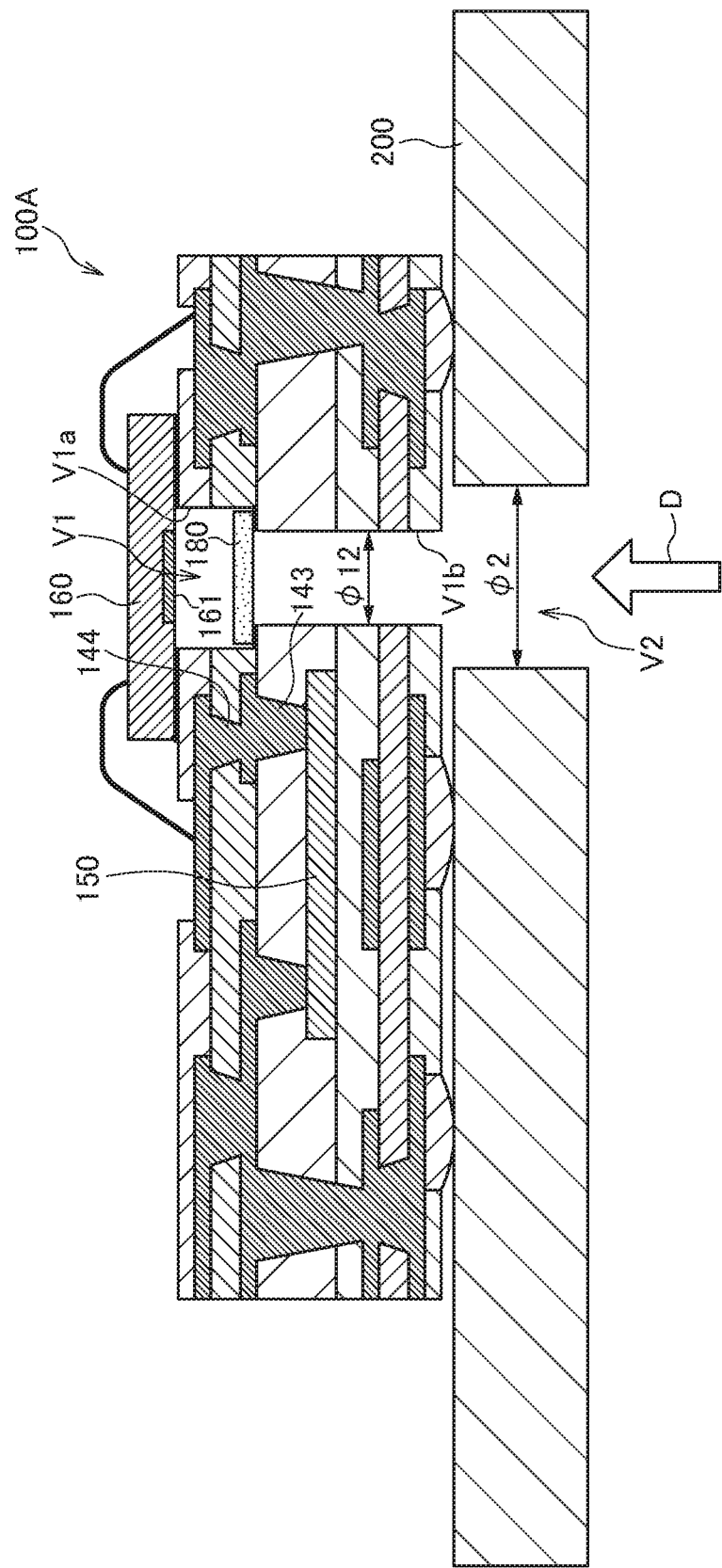
FIG. 4 is a schematic cross-sectional view illustrating a state where the sensor module according to the first embodiment is mounted on a motherboard.

FIG. 4 is a schematic cross-sectional view illustrating a state where the sensor module 100A according to the first embodiment is mounted on a motherboard 200.

As illustrated in FIG. 4, a through hole V2 is formed in the motherboard 200, and the sensor module 100A is mounted on the motherboard 200 such that the through hole V1 and the through hole V2 overlap each other in a plan view. Thus, the detection part 161 of the sensor chip 160 is exposed to atmosphere through the through holes V1 and V2 and the anti-dust filter 180. As a result, as dented by arrow D, air vibration, air pressure, air temperature or air composition is transmitted to the sensor chip 160, allowing the physical quantity thereof to be detected. Further, in the present embodiment, electronic components and the like are not mounted on the back surface of the sensor module 100A, so that it is possible to make a gap between the sensor module 100A and the motherboard 200 very small. This can enhance the sensitivity of the sensor. The gap between the sensor module 100A and the motherboard 200 may be filled with an underfill. In the example illustrated in FIG. 4, a diameter $\phi2$ of the through hole V2 is slightly larger than the diameter $\phi12$ of the second section V1b of the through hole V1; however, this is not essential in the present invention. Thus, the diameter $\phi2$ of the through hole V2 may be smaller than the diameter $\phi12$ of the second section V1b of the through hole V1, or the diameter $\phi2$ of the through hole V2 and the diameter $\phi12$ of the second section V1b may be substantially equal to each other.

The following describes a manufacturing method for the sensor package substrate 100 according to the present embodiment.

FIGS. 5 to 14 are process views for explaining the manufacturing method for the sensor package substrate 100 according to the present embodiment.

Figure 5:
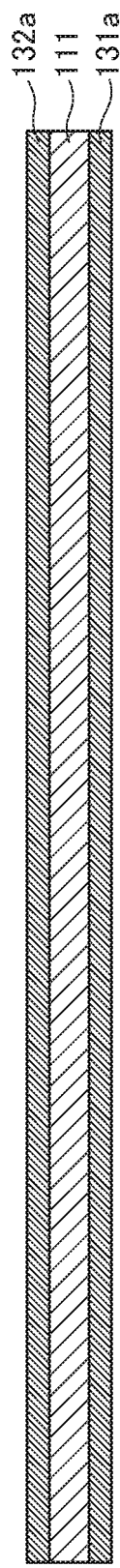
FIGS. 5 to 14 are process views for explaining the manufacturing method for the sensor package substrate according to one embodiment of the present invention.

As illustrated in FIG. 5, a base material (a work board) formed by attaching metal films 131a and 132a such as Cu foils to both surfaces of the insulating layer 111 including a core material such as glass fiber, i.e., a double-sided CCL (Copper Clad Laminate) is prepared. In order to facilitate the formation of the through hole V1 in the subsequent process and to ensure an appropriate degree of rigidity for easy handling, the thickness of the core material included in the insulating layer 111 is preferably equal to or less than 40 μm. The material forming the metal films 131a and 132a is not particularly limited, and examples include metal conductive materials such as Au, Ag, Ni, Pd, Sn, Cr, Al, W, Fe, Ti and SUS in addition to above-mentioned Cu and, among them, Cu is preferable in terms of conductivity and cost. The same is applied to other metal films to be described later.

The resin material forming the insulating layer 111 is not particularly limited as long as it can be formed into a sheet shape or a film shape, and examples include: a single element selected from the group consisting of vinyl benzyl resin, polyvinyl benzyl ether compound resin, bismaleimide triazine resin (BT resin), polyphenylene ether (polyphenylene ether oxide) resin (PPE, PPO), cyanate ester resin, epoxy+activated ester curing resin, polyphenylene ether resin (polyphenylene oxide resin), curable polyolefin resin, benzo cyclobutene resin, polyimide resin, aromatic polyester resin, aromatic liquid crystal polyester resin, polyphenylene sulfide resin, polyether imide resin, polyacrylate resin, polyetheretherketone resin, fluororesin, epoxy resin, phenolic resin, and benzoxazine resin in addition to glass epoxy; a material obtained by adding, to one of the above-listed resins, silica, talc, calcium carbonate, magnesium carbonate, aluminum hydroxide, magnesium hydroxide, aluminum borate whiskers, potassium titanate fiber, alumina, glass flakes, glass fiber, tantalum nitride, aluminum nitride, or the like; and a material obtained by adding, to one of the above-listed resins, metal oxide powder containing at least one metal selected from the group consisting of magnesium, silicon, titanium, zinc, calcium, strontium, zirconium, tin, neodymium, samarium, aluminum, bismuth, lead, lanthanum, lithium and tantalum, and these examples may be selectively used as appropriate from the viewpoints of electrical characteristics, mechanical characteristics, water absorption properties, reflow durability, etc. Further, examples of the core material included in the insulating layer 111 include a material blended with, e.g., resin fiber such as glass fiber or aramid fiber.

Figure 6:
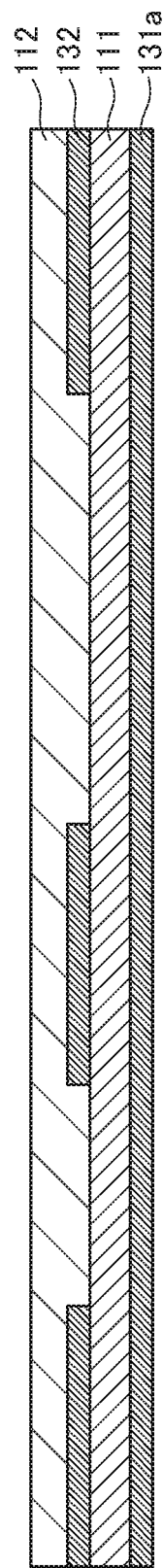

Next, as illustrated in FIG. 6, a known method such as photolithography is used to pattern the metal film 132a to form the wiring pattern 132. At this time, the metal film 132a is wholly removed at a position where the through hole V1 is ultimately to be formed. Further, for example, an uncured (B stage) resin sheet is laminated by vacuum pressure bonding or the like so as to embed therein the wiring pattern 132 to thereby form the insulating layer 112.

Figure 7:
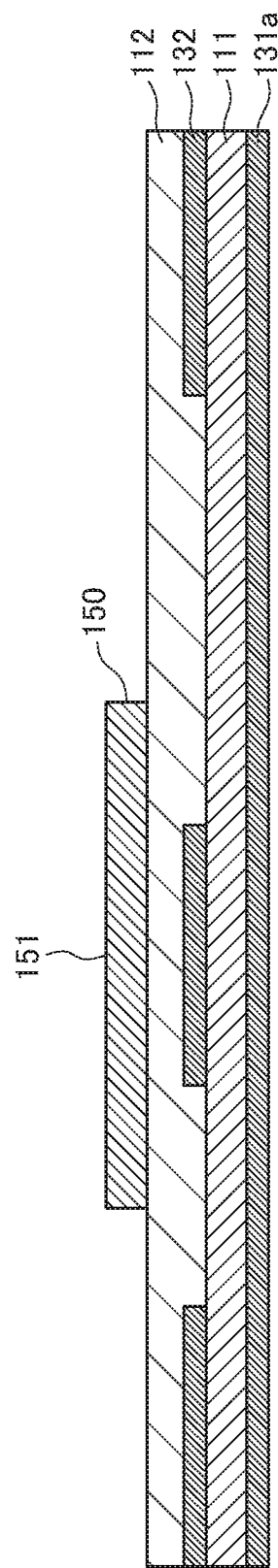

Then, as illustrated in FIG. 7, the controller chip 150 is placed on the insulating layer 112. The controller chip 150 is, e.g., a bare chip semiconductor IC and is face-up mounted such that a substantially rectangular plate-like main surface 151 faces upward. Not-shown many external terminals are provided on the main surface 151 of the controller chip 150. The controller chip 150 is polished at its back surface and thus has a thickness smaller than that of ordinary semiconductor ICs. Specifically, the thickness of the controller chip 150 is, e.g., equal to or less than 200 µm, preferably, about 50 µm to about 100 µm. In terms of cost, it is preferable to simultaneously apply machining to many controller chips 150 in a wafer state and, in this case, the back surface is first ground, and then the wafer is diced to obtain individual controller chips 150. Alternatively, when the wafer is diced into individual controller chips 150 or cut in half before thinning by means of polishing, the back surface can be polished while the main surface 151 of the controller chip 150 is covered with a thermosetting resin or the like. Thus, the processing order among the insulating film grinding, the electronic component back surface grinding and the dicing can be varied. The back surface of the controller chip 150 can be roughened by etching, plasma processing, laser processing, blasting, polishing with a grinder, buffing, chemical treatment or the like. With theses methods, it is possible to not only achieve thinning of the controller chip 150, but also to enhance adhesion to the insulating layer 112.

Figure 8:
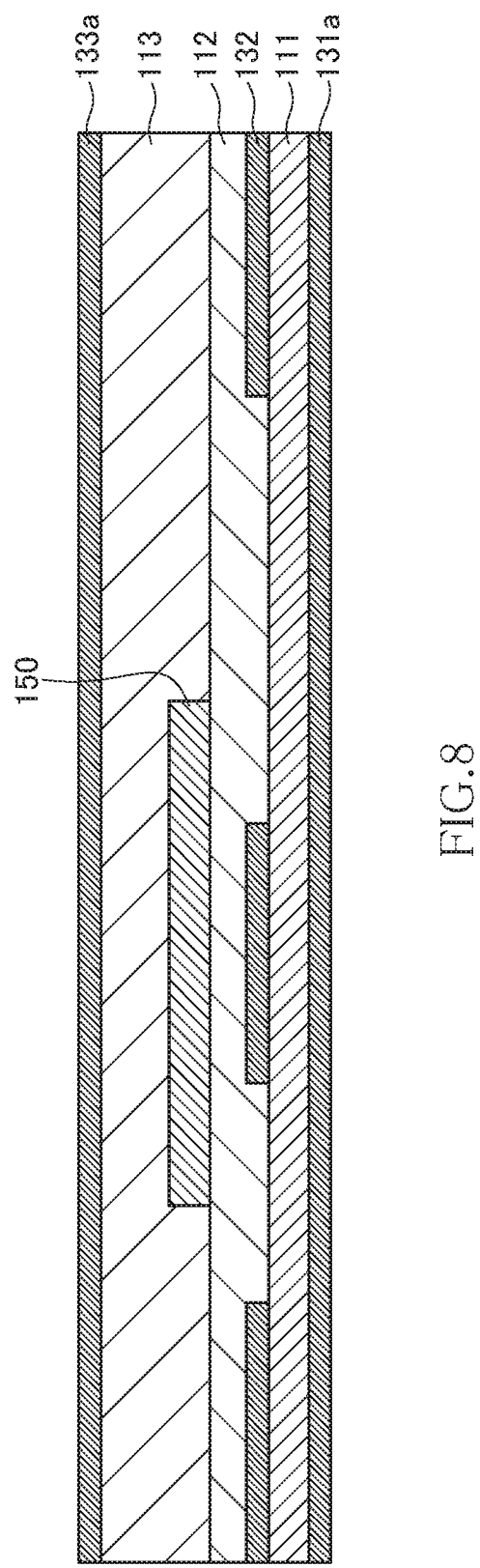

Then, as illustrated in FIG. 8, the insulating layer 113 and a metal film 133a are formed so as to cover the controller chip 150. Preferably, the insulating layer 113 is formed as follows: after application of an uncured or semi-cured thermosetting resin, the resin (when it is an uncured resin) is semi-cured by heating, and then the semi-cured resin and the metal film 133a are pressed together by a pressing means to obtain a cured insulating layer 113. The insulating layer 113 is preferably a resin sheet not containing fiber that prevents the controller chip 150 from being embedded. This enhances adhesion among the insulating layer 113, metal film 133a, insulating layer 112 and controller chip 150.

Figure 9:
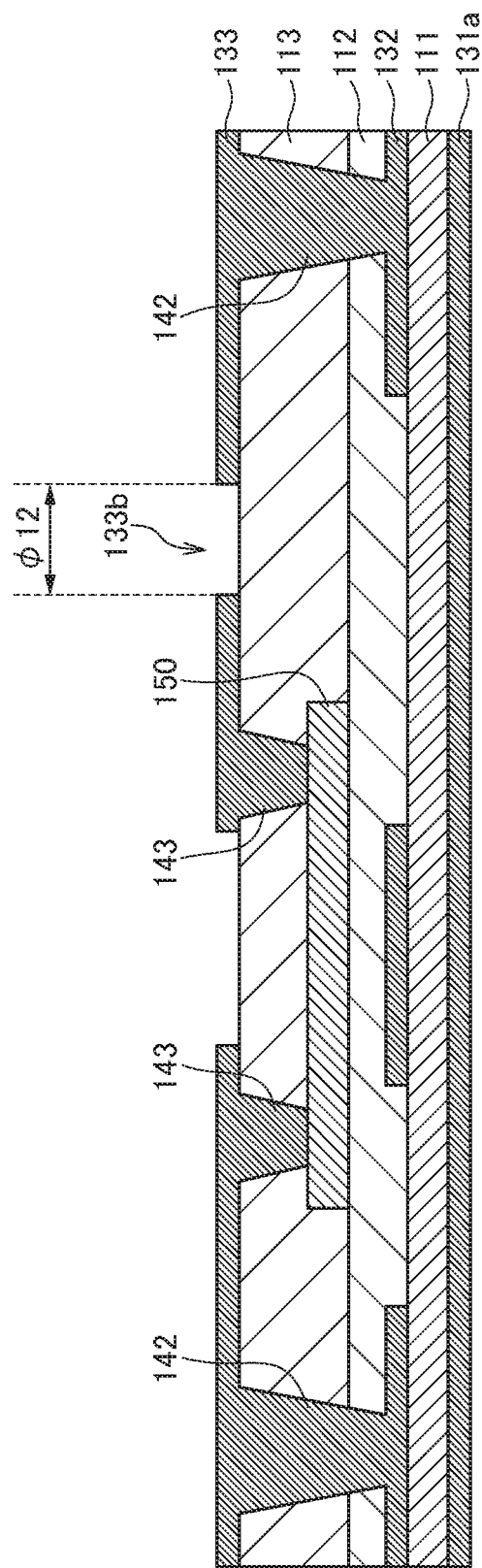

Then, as illustrated in FIG. 9, part of the metal film 133a is etching-removed by using a known method such as photolithography, and then known blasting or laser processing is applied to a predetermined location where the metal film 133a has been removed to form through holes in the insulating layers 112 and 113. After that, electroless plating and electrolytic plating are applied, followed by patterning of the metal film 133a by a known method, to thereby form the wiring pattern 133 and through hole conductors 142 and 143. At this time, at a position where the through hole V1 is ultimately to be formed, an opening 133b corresponding to the diameter ϕ12 of the second section V1b is formed in the metal film 133a. The through hole conductor 142 penetrates the insulating layers 113 and 112 to connect the wiring patterns 132 and 133, and the through hole conductor 143 penetrates the insulating layer 113 to connect the wiring pattern 133 and the controller chip 150.

Figure 10:
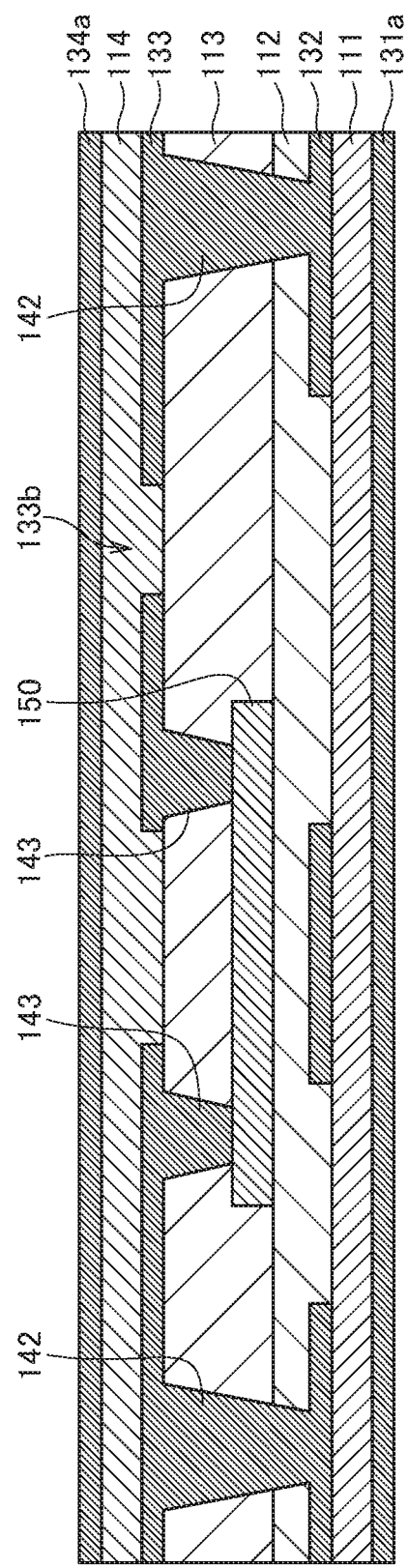

Then, as illustrated in FIG. 10, a sheet having the insulating layer 114 and a metal film 134a laminated thereon is hot-pressed under vacuum so as to embed therein the wiring pattern 133. The material and thickness of the insulating layer 114 may be the same as those of the insulating layer 111.

Figure 11:
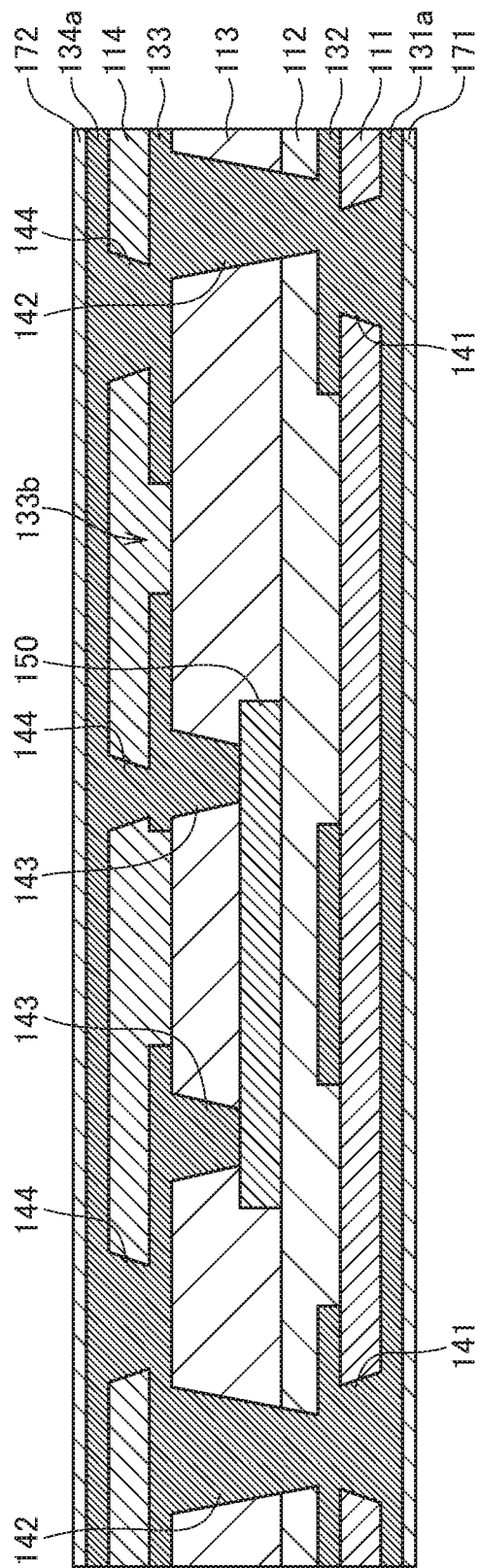

Then, as illustrated in FIG. 11, part of the metal film 131a and part of the metal film 134a are etching-removed by using a known method such as photolithography, and then known blasting or laser processing is applied to predetermined locations where the metal films 131a and 134a have been removed to form through holes in the insulating layers 111 and 114. After that, electroless plating and electrolytic plating are applied to form through hole conductors 141 and 144. The through hole conductor 141 penetrates the insulating layer 111 to connect the wiring patterns 131 and 132, and the through hole conductor 144 penetrates the insulating layer 114 to connect the wiring patterns 133 and 134. After that, photosensitive dry films 171 and 172 are formed on the surfaces of the metal films 131a and 134a, respectively.

Figure 12:
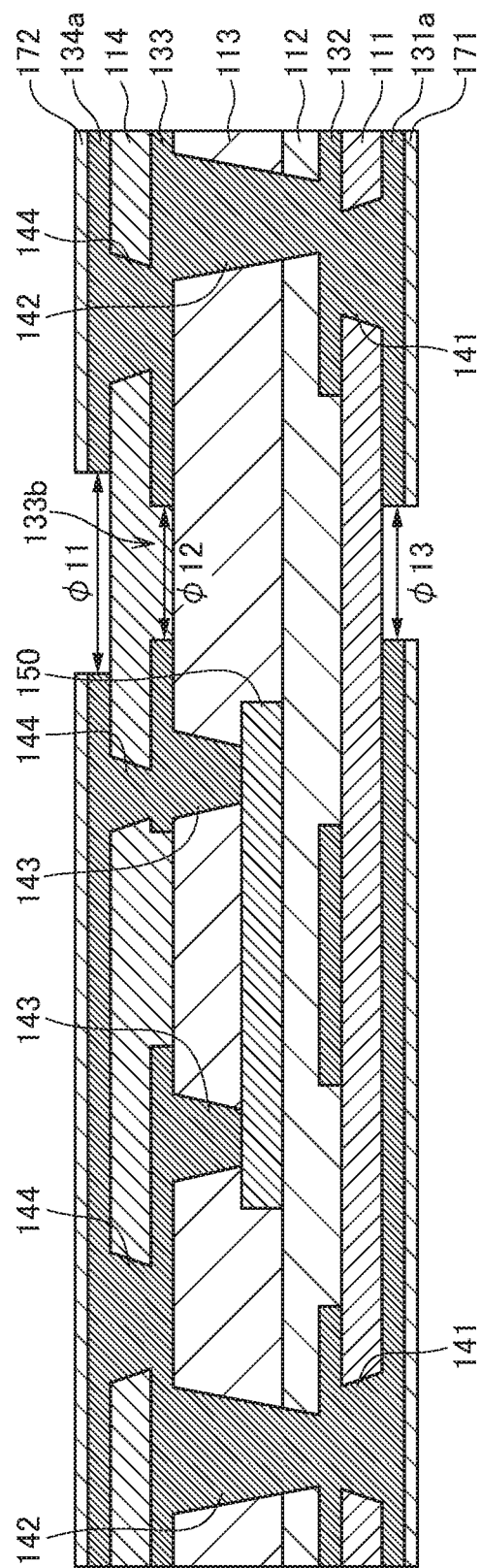

Then, as illustrated in FIG. 12, the dry films 171 and 172 are removed by photolithography at a planar position where the through hole V1 is to be formed, and the metal films 131a and 134a are removed at positions where they are exposed respectively through the dry films 171 and 172. At this time, the opening diameter of the dry film 172 positioned on the upper surface side is set to ϕ11 (>ϕ12), and the opening diameter of the dry film 171 positioned on the lower surface side is set to ϕ13. Accordingly, the opening diameter formed in the metal film 134a is ϕ11, and the opening diameter formed in the metal film 131a is ϕ13. The opening diameter ϕ13 of the dry film 171 may be designed to be equal to ϕ12 or larger than ϕ12 considering process variations such as laminating misalignment. Further, the opening diameter ϕ13 of the dry film 171 may be increased by way of laser processing or blasting to be described later, so that the diameter ϕ13 may be designed so as to be slightly smaller than ϕ12 in the initial state before the laser processing or blasting being undergone and to be larger than ϕ12 in the state after the laser processing or blasting.

Figure 13:
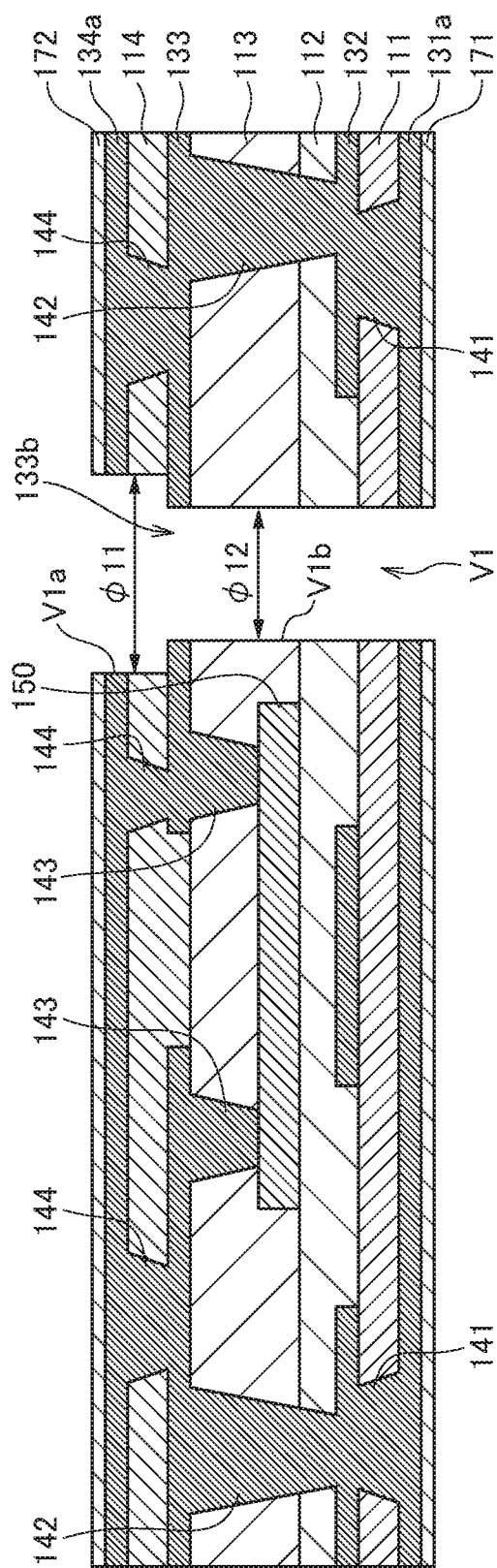

In this state, as illustrated in FIG. 13, laser processing or blasting is applied to the front and back sides to form the through hole V1 penetrating the insulating layers 111 to 114. In the laser processing or blasting, the wiring pattern 133 positioned around the opening 133b functions as a stopper, so that the diameter of the through hole V1 positioned above the wiring pattern 133 is ϕ11, and the diameter of the through hole V1 positioned below the wiring pattern 133 is ϕ12. That is, the inner diameter of the through hole V1 is changed stepwise in the depth direction.

Figure 14:
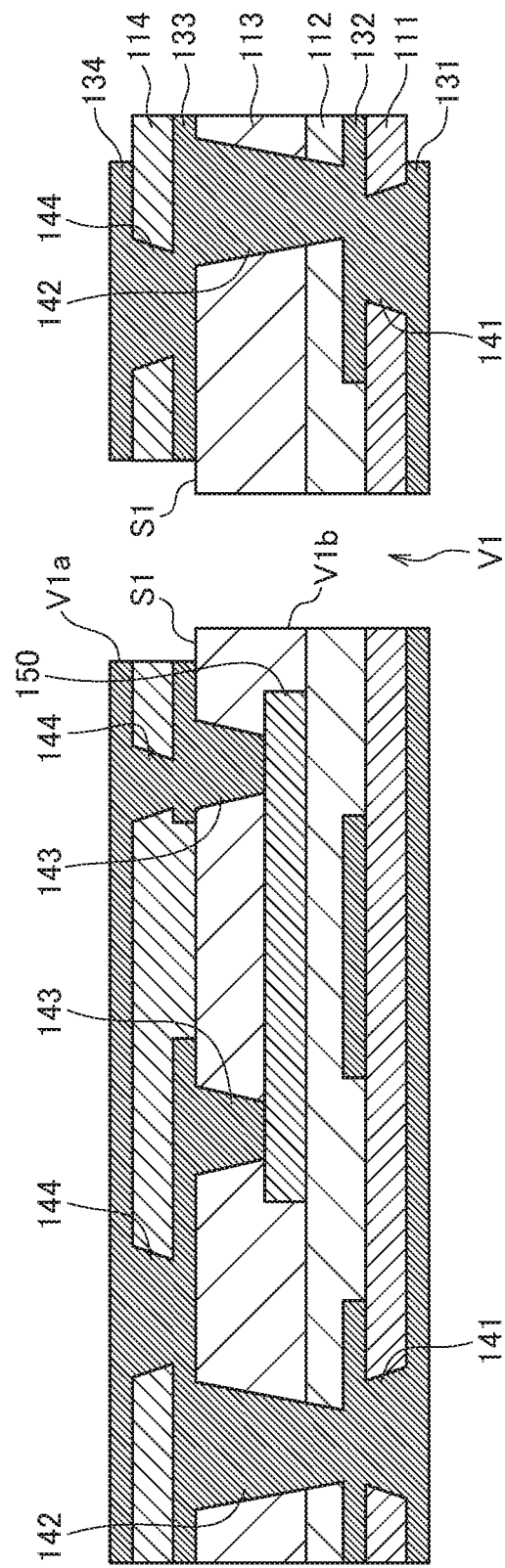

Then, as illustrated in FIG. 14, the dry films 171 and 172 are removed, and then the metal films 131a and 134a are patterned by a known method such as photolithography to thereby form the wiring patterns 131 and 134. At this time, the exposed part of the wiring pattern 133, that is, part of the wiring pattern 133 that functions as a stopper is also removed. As a result, the through hole V1 defined by the first and second sections V1a and V1b is formed, and the step part S1 is formed between the first and second sections V1a and V1b. However, the exposed part of the wiring pattern 133 may not necessarily be removed and may be used as the step part S1.

Then, as illustrated in FIG. 1, the solder resists 121 and 122 are formed on the surfaces of the insulating layers 114 and 111, respectively, and surface treatment for component mounting is applied at positions where the wiring patterns 134 and 131 are exposed respectively through the solder resists 121 and 122. The surface treatment may be Cu—OSP, Ni/Au plating, ENEPIG, and solder leveler treatment, but not limited thereto as long as it aims to prevent oxidation of the wiring pattern and to improve quality in component mounting in the subsequent process.

Thus, the sensor package substrate 100 according to the present embodiment is completed.

As described above, in the present embodiment, laser processing or blasting is performed with the exposed part of the wiring pattern 133 used as a stopper, thereby allowing the inner diameter of the through hole V1 to be changed stepwise in the depth direction. However, in the present invention, the through hole V1 may not necessarily be formed using laser processing or blasting and may be formed by performing drilling work from the front and back sides using two drills having different diameters. However, burrs or substrate cracking can occur in the drilling work, so that the use of laser processing or blasting is preferred in terms of product reliability. Further, when laser processing or blasting is to be used, the positional accuracy of the through hole V1 is determined by alignment of the photolithography to the dry films 171 and 172 and the wiring pattern 133, so that it is possible to improve the positional accuracy by one or more orders of magnitude as compared with a pin alignment method which is adopted in drilling work. Particularly, when the through hole V1 is formed by blasting, many through holes V1 can be formed simultaneously in the form of an assembly substrate, allowing a reduction in manufacturing cost. Furthermore, unlike laser processing, improvement in characteristics and quality can be achieved due to smear removal or remaining and dropping of glass fiber.

Figure 15:
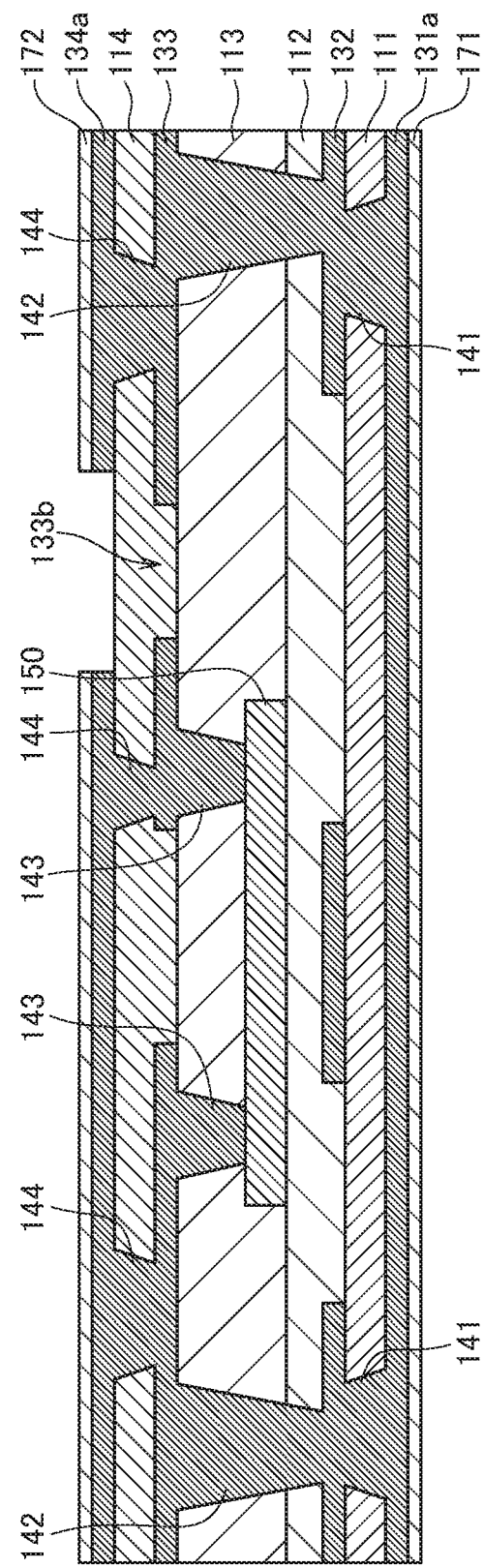
FIG. 15 is a process view for explaining a method for laser processing or blasting from one direction.

Further, although laser processing or blasting is applied to the front and back sides in the example illustrated in FIGS. 12 to 14, it may be applied to only the surface 101 side. For example, the through hole V1 may be formed as illustrated in FIG. 15. That is, the dry film 171 is not removed, while the dry film 172 is removed at a planar position where the through hole V1 is to be formed. Then, part of the metal film 134a that is exposed through the dry film 172 is removed, and laser processing or blasting is applied to the one surface 101 side to thereby form the through hole V1 so as to penetrate the insulating layers 111 to 114. In this case as well, the wiring pattern 133 functions as a stopper, thereby allowing the inner diameter of the through hole V1 to be changed in the depth direction. The metal film 131a remaining at the bottom of the through hole V1 may be removed by etching or the like.

Figure 16:
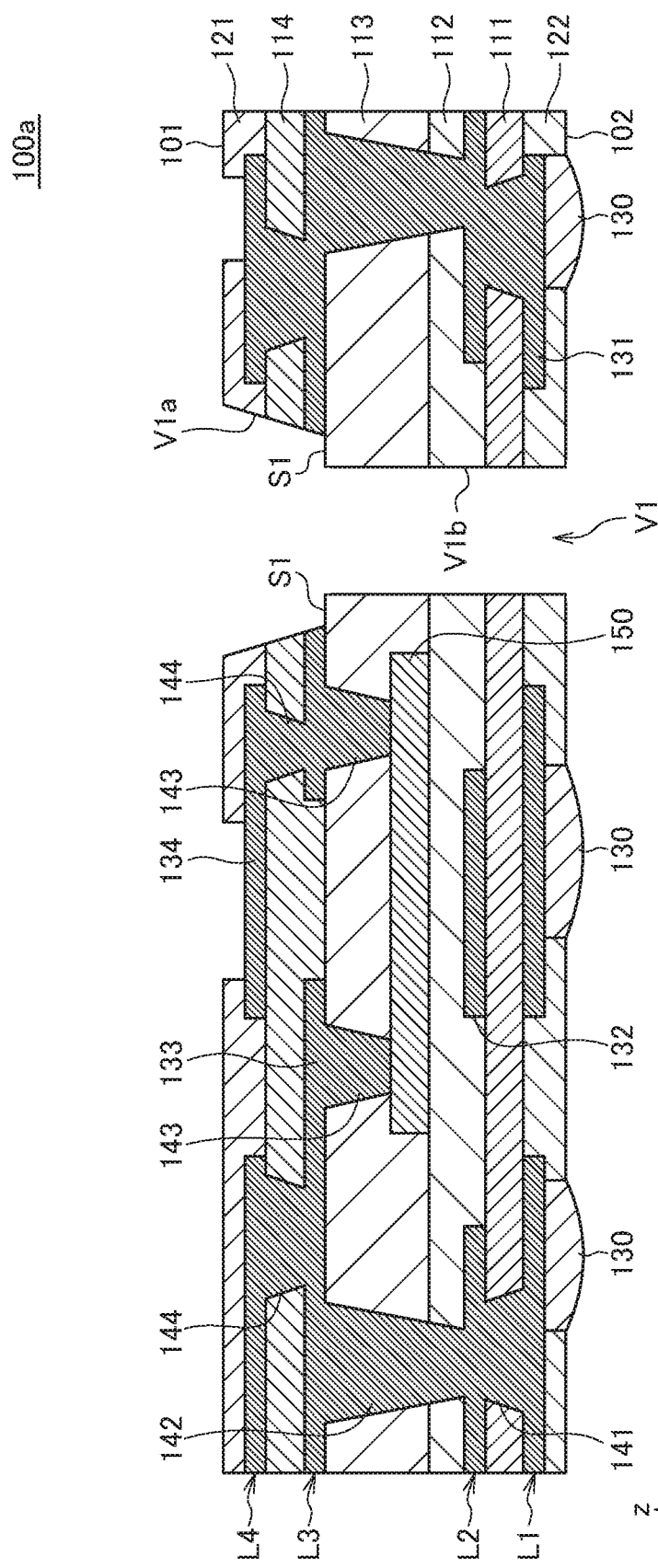
FIG. 16 is a schematic cross-sectional view for explaining the structure of a sensor package substrate according to a first modification.
Figure 17:
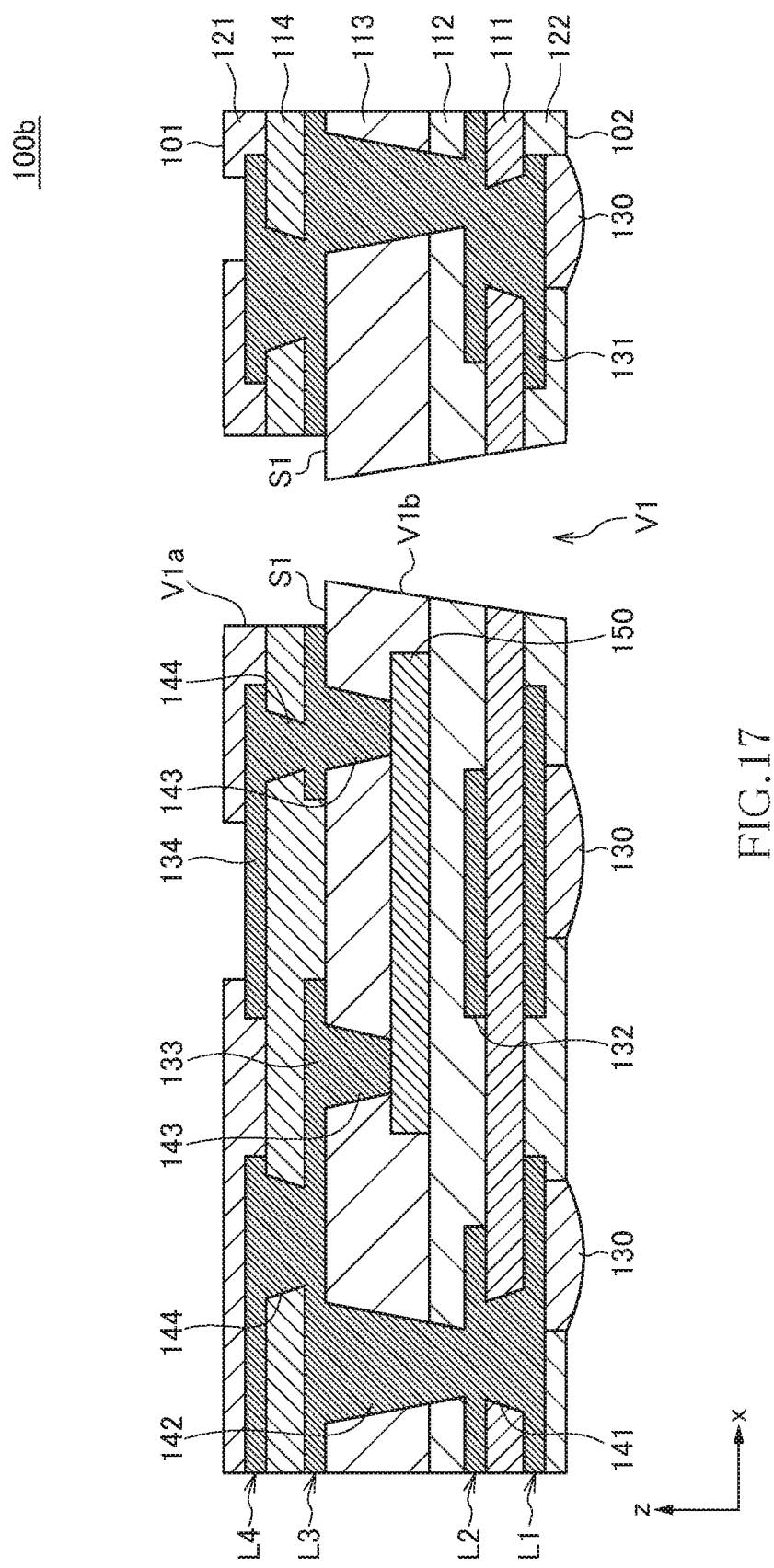
FIG. 17 is a schematic cross-sectional view for explaining the structure of a sensor package substrate according to a second modification.
Figure 18:
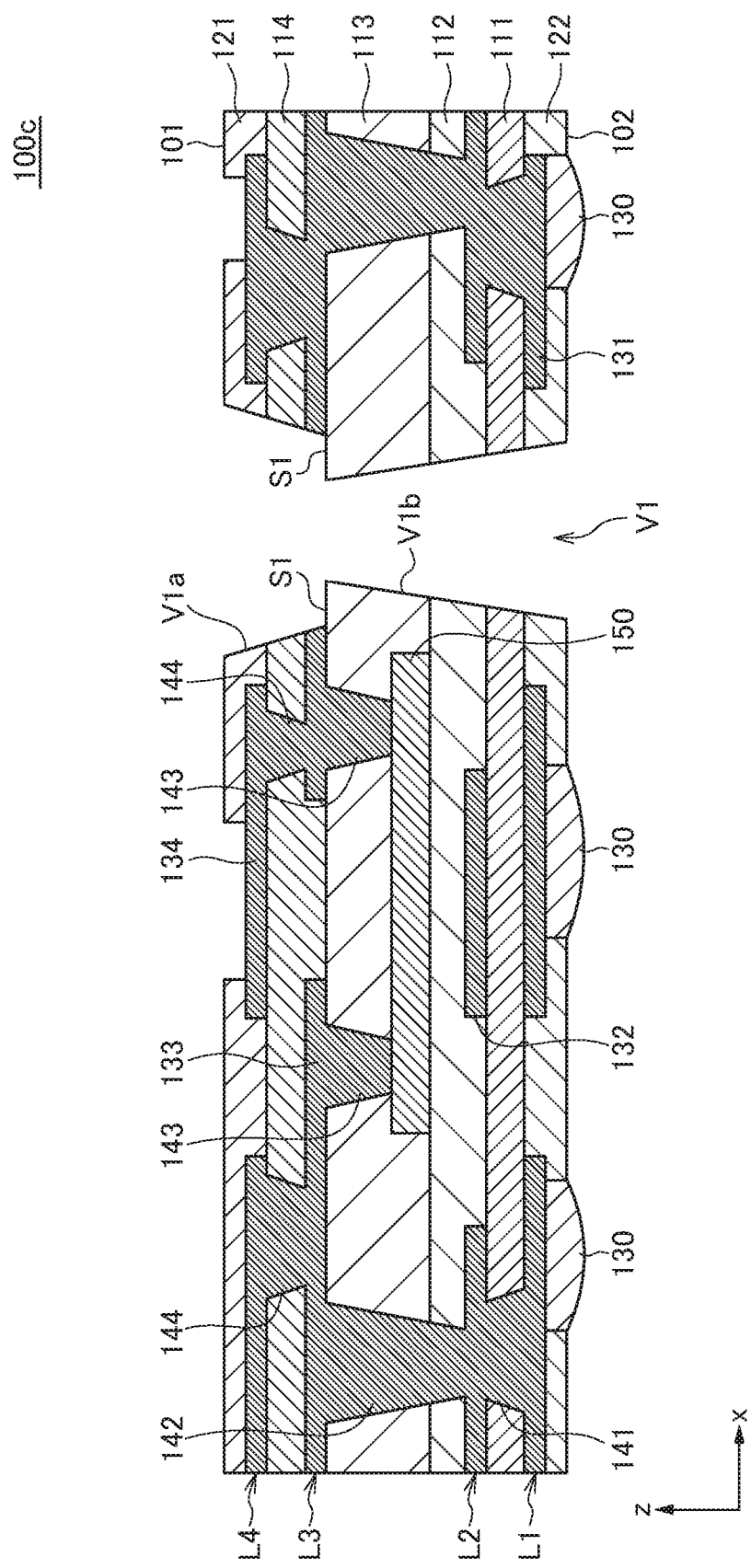
FIG. 18 is a schematic cross-sectional view for explaining the structure of a sensor package substrate according to a third modification.

Further, the through hole V1 can be made to have a tapered shape in which the diameter thereof is continuously changed in the depth direction according to the setting of laser irradiation conditions or blasting conditions. This is because laser processing or blasting has characteristics in which the machining amount is reduced in the depth direction from the machining surface side. For example, in a sensor package substrate 100a according to a first modification illustrated in FIG. 16, the diameter of the first section V1a is continuously increased from the other surface 102 toward the one surface 101. The diameter of the second section V1b is substantially constant. In a sensor package substrate 100b according to a second modification illustrated in FIG. 17, the diameter of the second section V1b is continuously increased from the one surface 101 toward the other surface 102. The diameter of the first section V1a is substantially constant. In a sensor package substrate 100c according to a third modification illustrated in FIG. 18, the diameter of the first section V1a is continuously increased from the other surface 102 toward the one surface 101, and the diameter of the second section V1b is continuously increased from the one surface 101 toward the other surface 102. The through hole V1 formed into such as shape has a so-called megaphone structure, so that when the sensor chip 160 is a microphone, transmission characteristics of acoustic waves can be improved.

Figure 19:
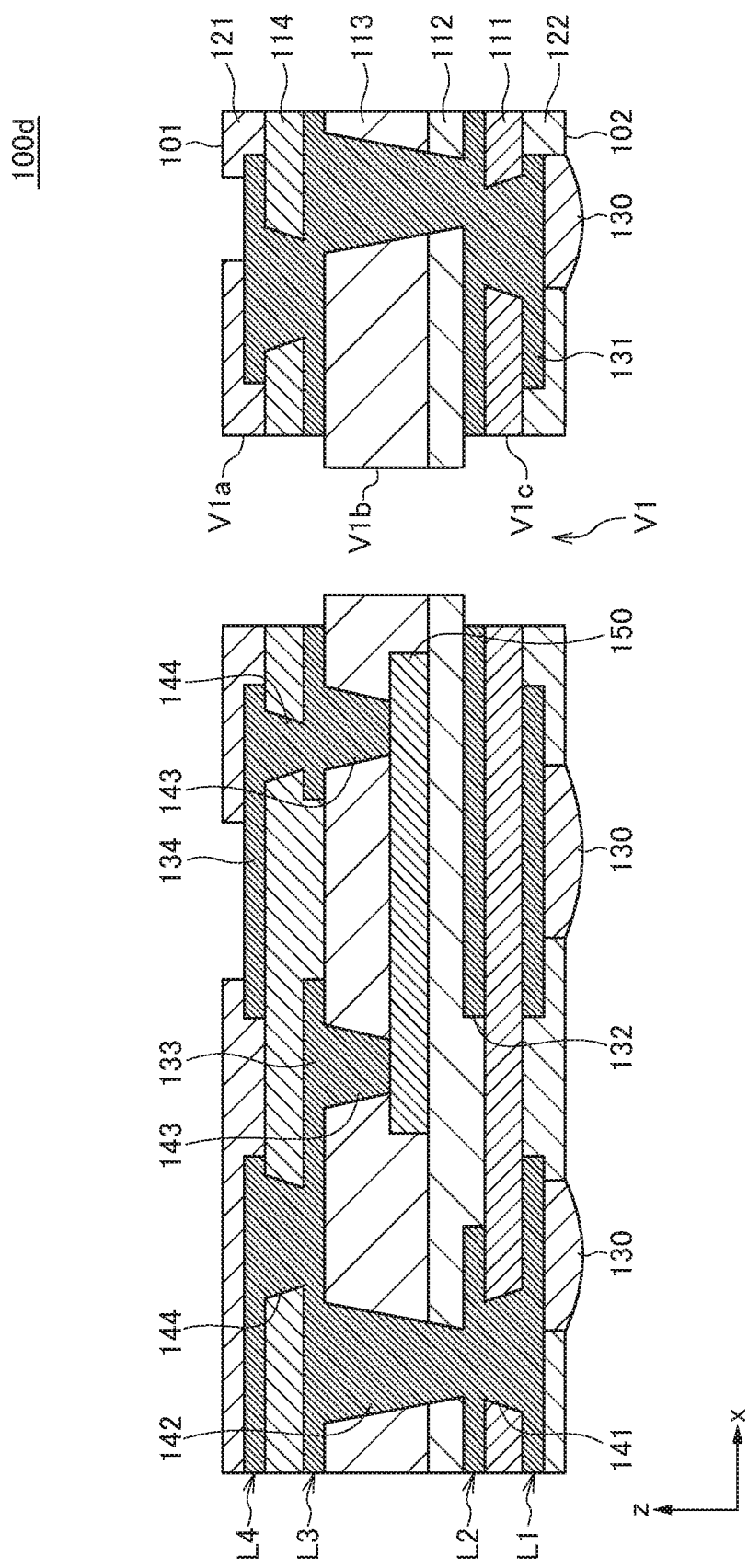
FIG. 19 is a schematic cross-sectional view for explaining the structure of a sensor package substrate according to a fourth modification.

In place of, or in addition to forming the second section V1b into a tapered shape, a third section V1c opened to the other surface 102 side may be formed like a sensor package substrate 100d according to a fourth modification illustrated in FIG. 19. In this case, the second section V1b is positioned between the first and third sections V1a and V1c. Such a shape can be obtained by applying laser processing or blasting to the front and back sides with the wiring patterns 132 and 133 used as a stopper. In this case as well, the opening diameter of the through hole V1 at the other surface 102 side is increased, allowing external atmosphere to easily enter inside the through hole V1, which can enhance detection characteristics of the sensor chip 160.

Figure 20:
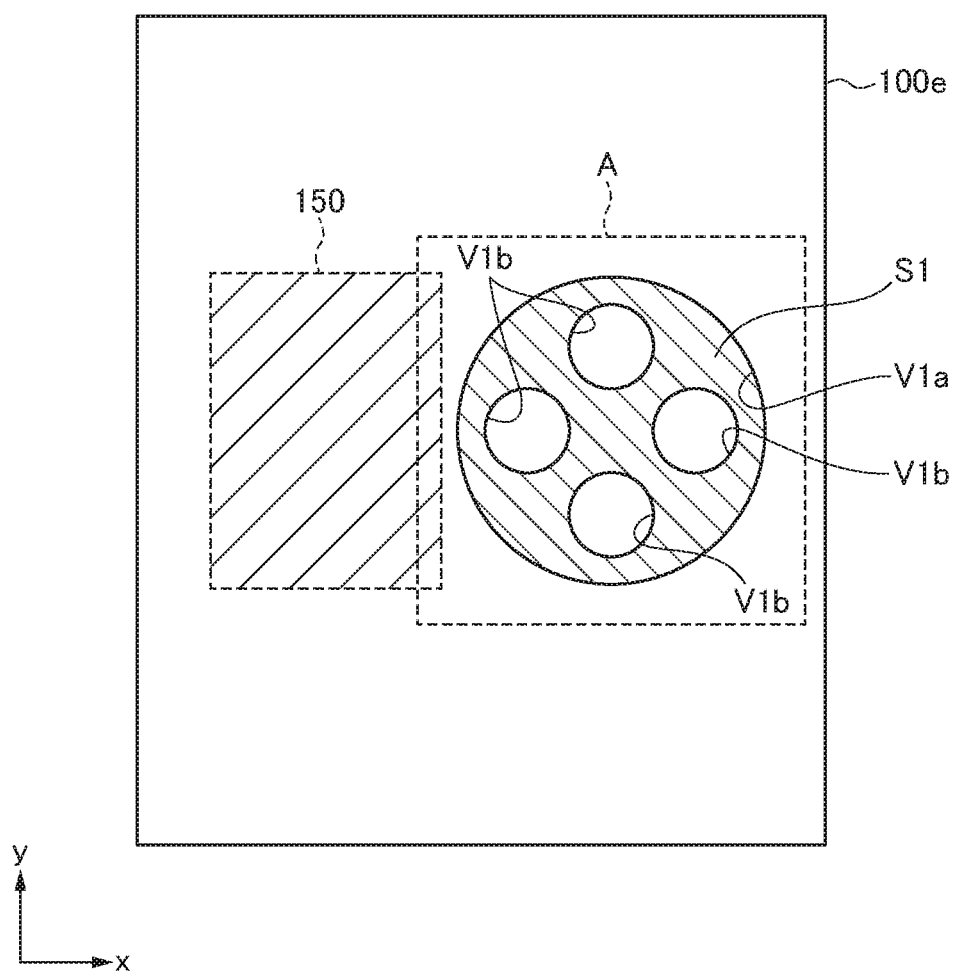
FIG. 20 is a schematic cross-sectional view for explaining the structure of a sensor package substrate according to a fifth modification.
Figure 21:
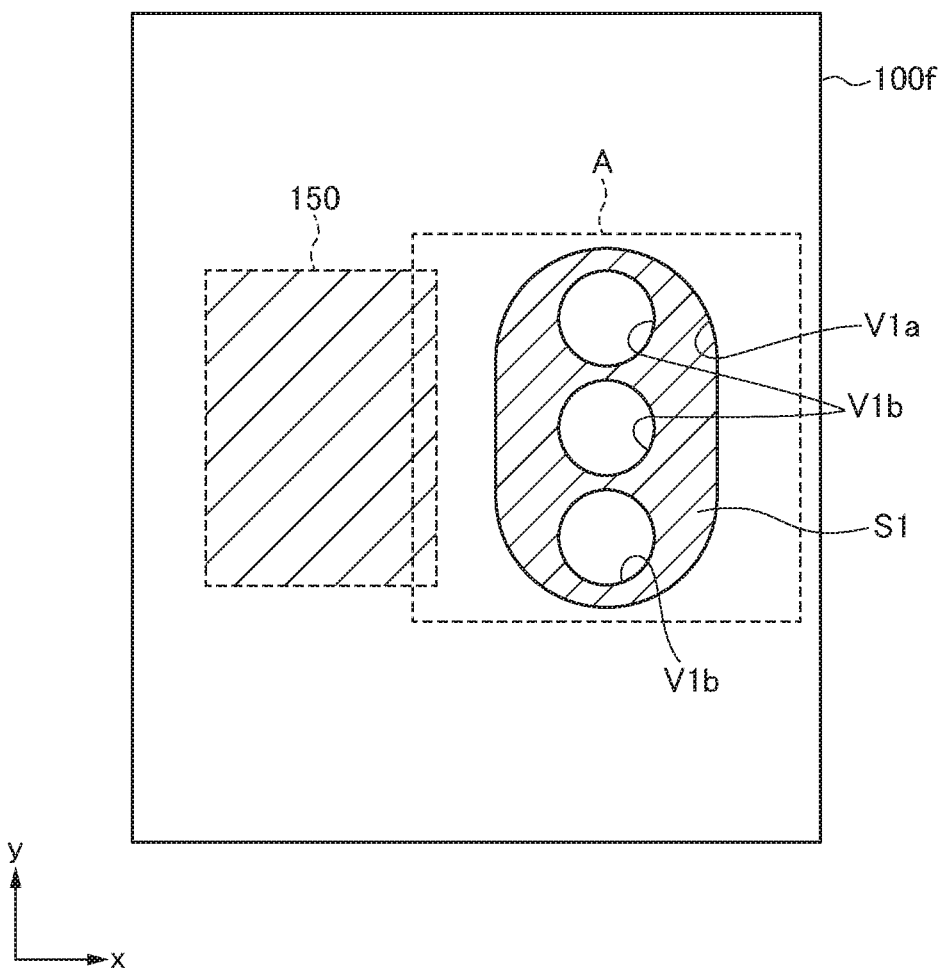
FIG. 21 is a schematic cross-sectional view for explaining the structure of a sensor package substrate according to a sixth modification.

The number of the through holes V1 is also not particularly limited and, like a sensor package substrate 100e according to a fifth modification illustrated in FIG. 20, a plurality of (four in the example of FIG. 20) the second sections V1b may be formed so as to overlap the first section V1a in a plan view. Further, the planar shape of the through hole V1 is not limited to a circular shape, but may be a non-circular shape according to the purpose. For example, like a sensor package substrate 100f according to a sixth modification illustrated in FIG. 21, a plurality of (three in the example of FIG. 21) the second sections V1b may be formed so as to overlap the first section V1a having an elliptical planar shape.

Figure 22:
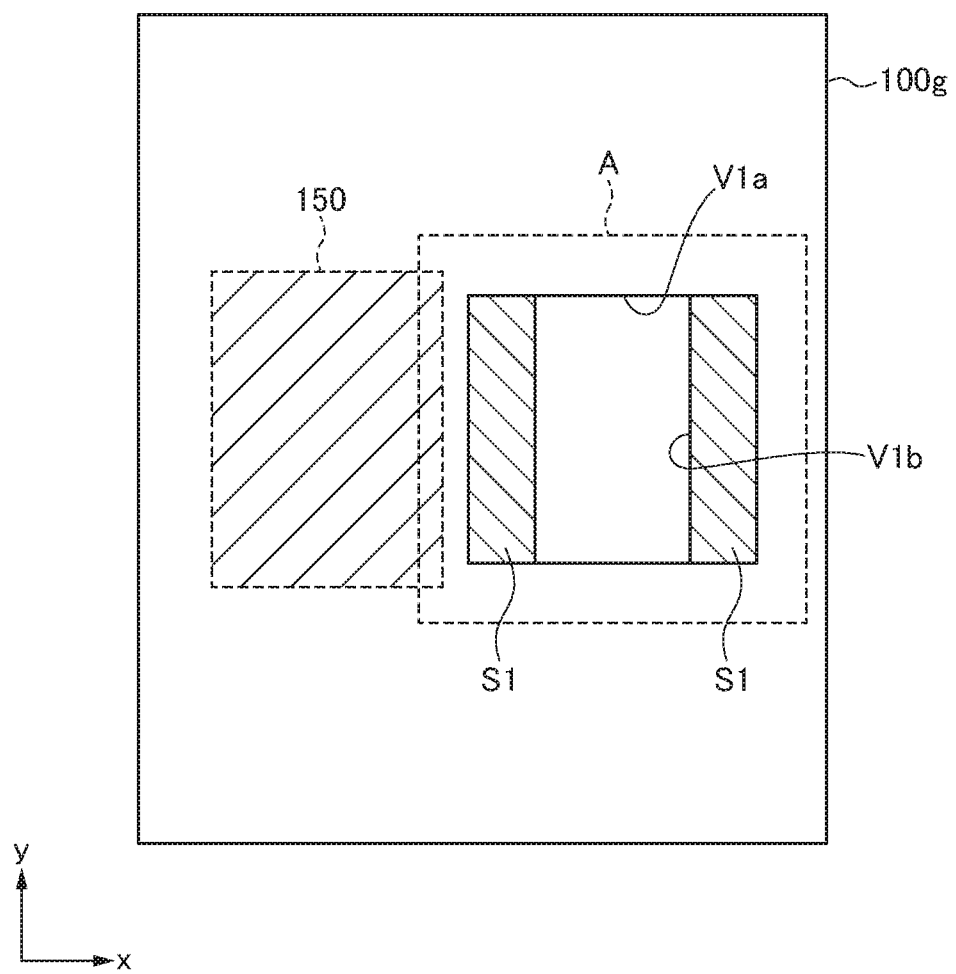
FIG. 22 is a schematic cross-sectional view for explaining the structure of a sensor package substrate according to a seventh modification.

Further, like a sensor package substrate 100g according to a seventh modification illustrated in FIG. 22, the first and second sections V1a and V1b may each be formed into a rectangular planar shape, and the width of the second section V1b in the x-direction may be made smaller than the width of the first section V1a in the x-direction. In the example illustrated in FIG. 22, the widths of the first and second sections V1a and V1b in the y-direction are substantially equal to each other, whereby the step part S1 is formed at two locations.

As described above, the sensor module 100A according to the present embodiment has the step part S1 inside the through hole V1, and the anti-dust filter 180 is mounted at the step part S1. Thus, the depth position of the anti-dust filter 180 is defined by the step part S1, and the anti-dust filter 180 is fixed more securely inside the through hole V1, making it possible to prevent the anti-dust filter 180 from falling off from the through hole V1. In addition, since the anti-dust filter 180 is provided inside the through hole V1, the volume of the space 191 formed by the cap 190 can be increased. Further, when the thermal expansion coefficient of the insulating layers 111 and 114 is made smaller than that of the insulating layers 112 and 113, it is possible to reduce the distortion of the through hole V1 due to a temperature change or stress generated in a portion where components are connected.

The following describes other embodiments of the present invention.

Figure 23:
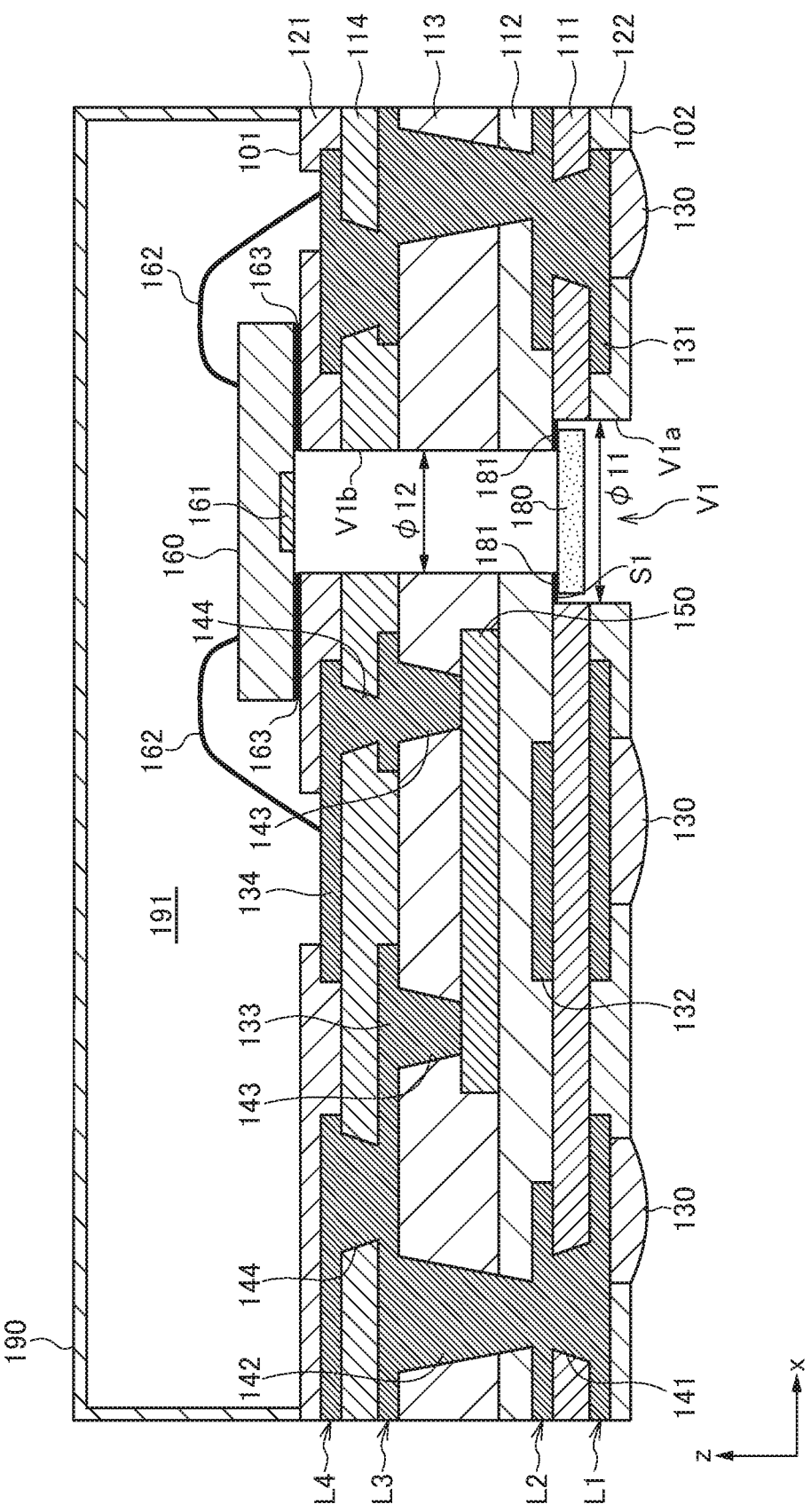
FIG. 23 is a schematic cross-sectional view for explaining the structure of a sensor module according to a second embodiment of the present invention.

FIG. 23 is a schematic cross-sectional view for explaining the structure of a sensor module 100B according to a second embodiment.

The sensor module 100B according to the second embodiment differs from the sensor module 100A according to the first embodiment in that the second section V1b is opened to the one surface 101 side of the sensor package substrate, and that the first section V1a is opened to the other surface 102 side. As in the first embodiment, the anti-dust filter 180 is mounted at the step part S1 positioned at the boundary between the first and second sections V1a and V1b. Other configurations are the same as those of the sensor module 100A according to the first embodiment, so the same reference numerals are given to the same elements, and overlapping description will be omitted.

In the present embodiment, the first section V1a having a larger diameter is positioned on the other surface 102 side, so that the step part S1 faces the other surface 102 side. Even with such a configuration, the anti-dust filter 180 can be disposed securely inside the through hole V1. Further, the opening diameter of the through hole V1 on the other surface 102 side is increased, allowing external atmosphere to easily enter inside the through hole V1.

Figure 24:
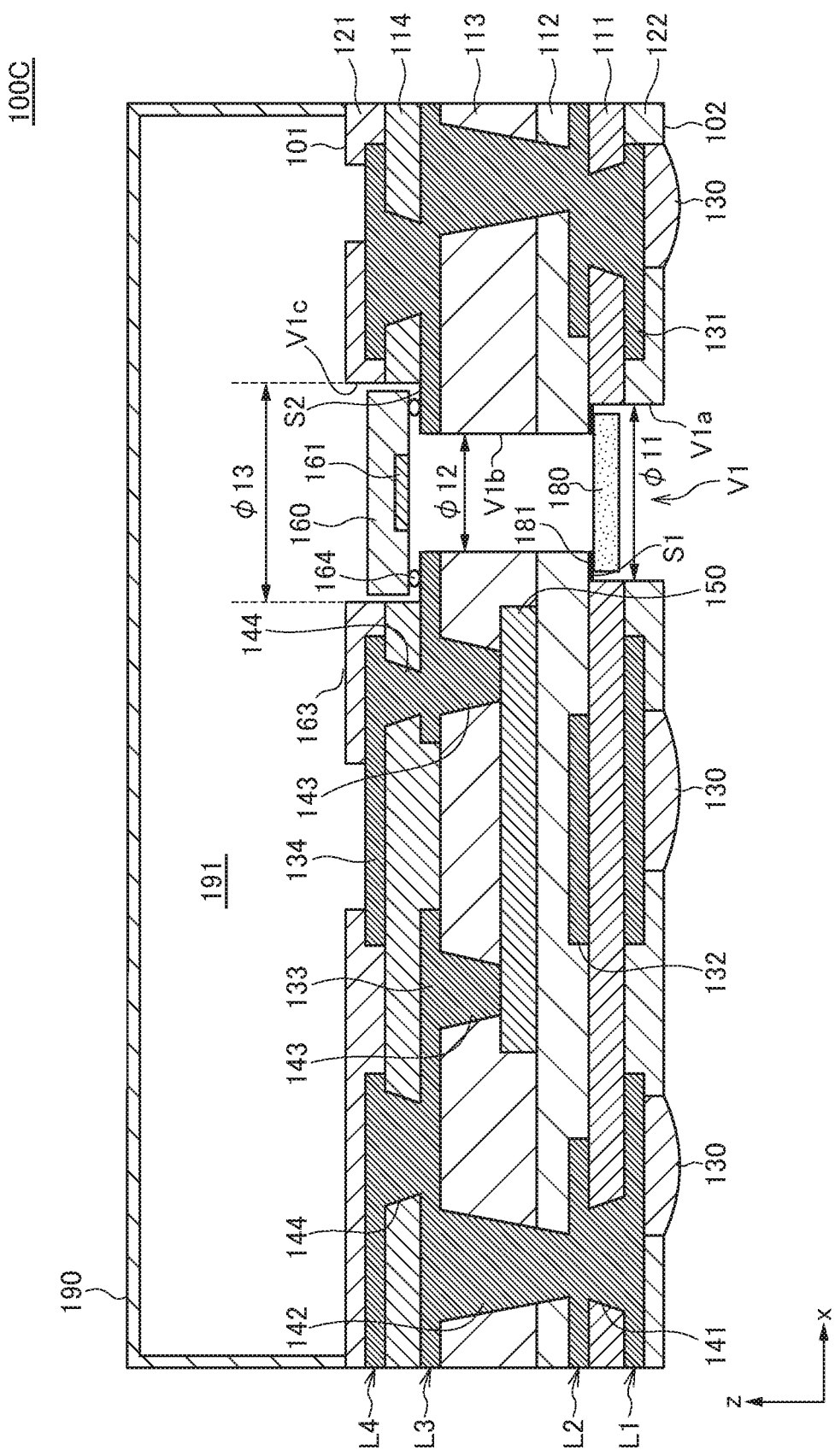
FIG. 24 is a schematic cross-sectional view for explaining the structure of a sensor module according to a third embodiment of the present invention.

FIG. 24 is a schematic cross-sectional view for explaining the structure of a sensor module 100C according to a third embodiment.

The sensor module 100C according to the third embodiment differs from the sensor module 100B according to the second embodiment in that it has a third section V1c opened to the one surface 101 side and that the sensor chip 160 is mounted at a step part S2 positioned at the boundary between the second and third sections V1b and V1c. Other configurations are the same as those of the sensor module 100B according to the second embodiment, so the same reference numerals are given to the same elements, and overlapping description will be omitted.

As in the first and second embodiments, the anti-dust filter 180 is mounted at the step part S1 positioned at the boundary between the first and second sections V1a and V1b. A diameter ϕ13 of the third section V1c is larger than at least the diameter ϕ12 of the second section V1b, whereby the step part S2 is formed at the boundary between the second and third sections V1b and V1c. The wiring pattern 133 is exposed to the step part S2 and is electrically connected to a terminal electrode provided on the sensor chip 160 through a solder ball 164 or the like.

As described above, in the present embodiment, both the sensor chip 160 and the anti-dust filter 180 are positioned inside the through hole V1, making it possible to further increase the volume of the space 191 formed by the cap 190.

In the present embodiment, the wiring pattern 134 constituting the wiring layer L4 may be omitted.

Figure 25:
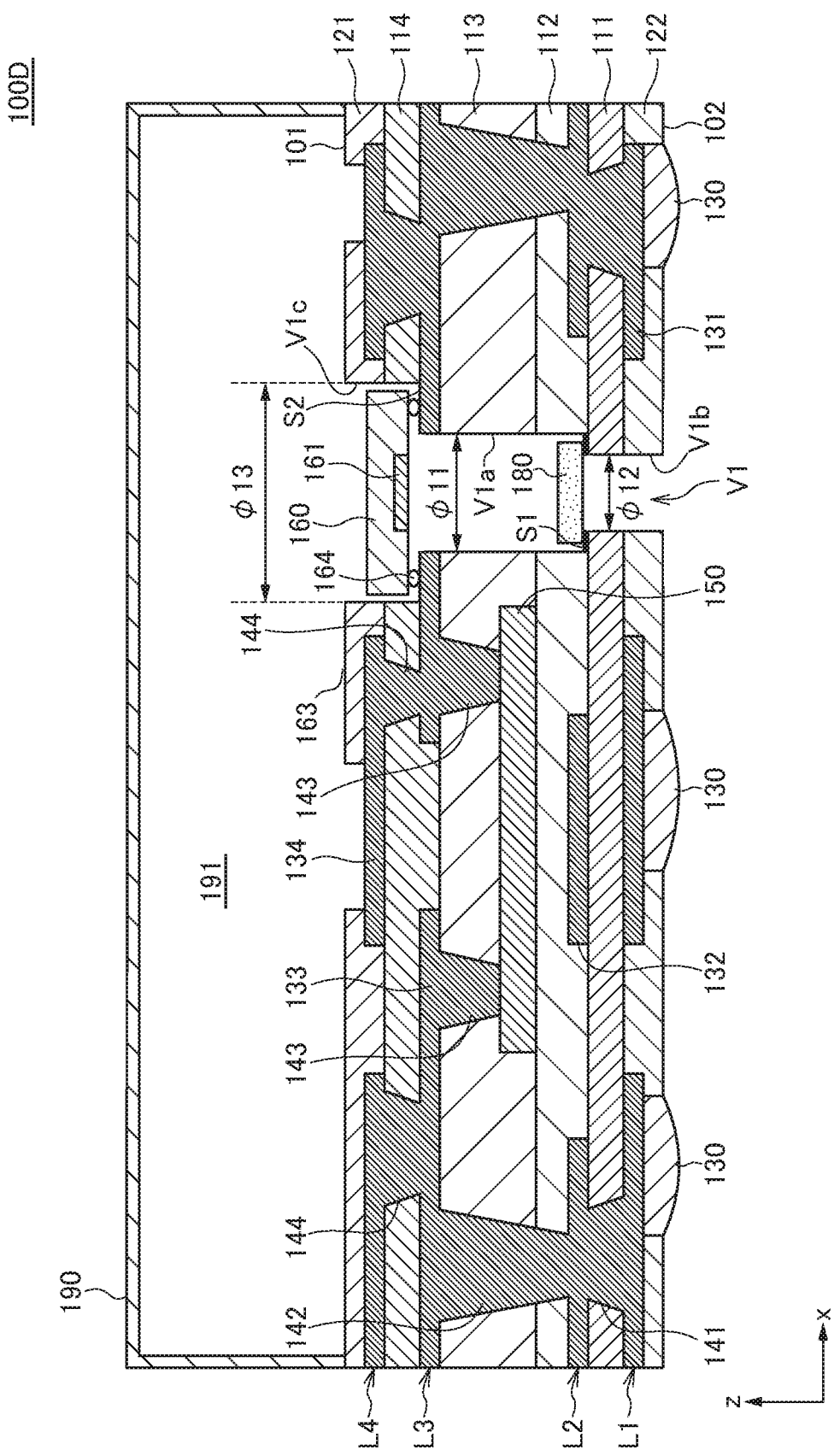
FIG. 25 is a schematic cross-sectional view for explaining the structure of a sensor module according to a fourth embodiment of the present invention.

FIG. 25 is a schematic cross-sectional view for explaining the structure of a sensor module 100D according to a fourth embodiment.

The sensor module 100D according to the fourth embodiment differs from the sensor module 100C according to the third embodiment in that the positional relationship between the first and second sections V1a and V1b is reversed. That is, in the present embodiment, the first section V1a is positioned between the second and third sections V1b and V1c. Other configurations are the same as those of the sensor module 100C according to the third embodiment, so the same reference numerals are given to the same elements, and overlapping description will be omitted.

Even with such a configuration, both the sensor chip 160 and the anti-dust filter 180 are positioned inside the through hole V1, making it possible to further increase the volume of the space 191 formed by the cap 190. In the present embodiment as well, the wiring pattern 134 constituting the wiring layer L4 may be omitted.

Figure 26:
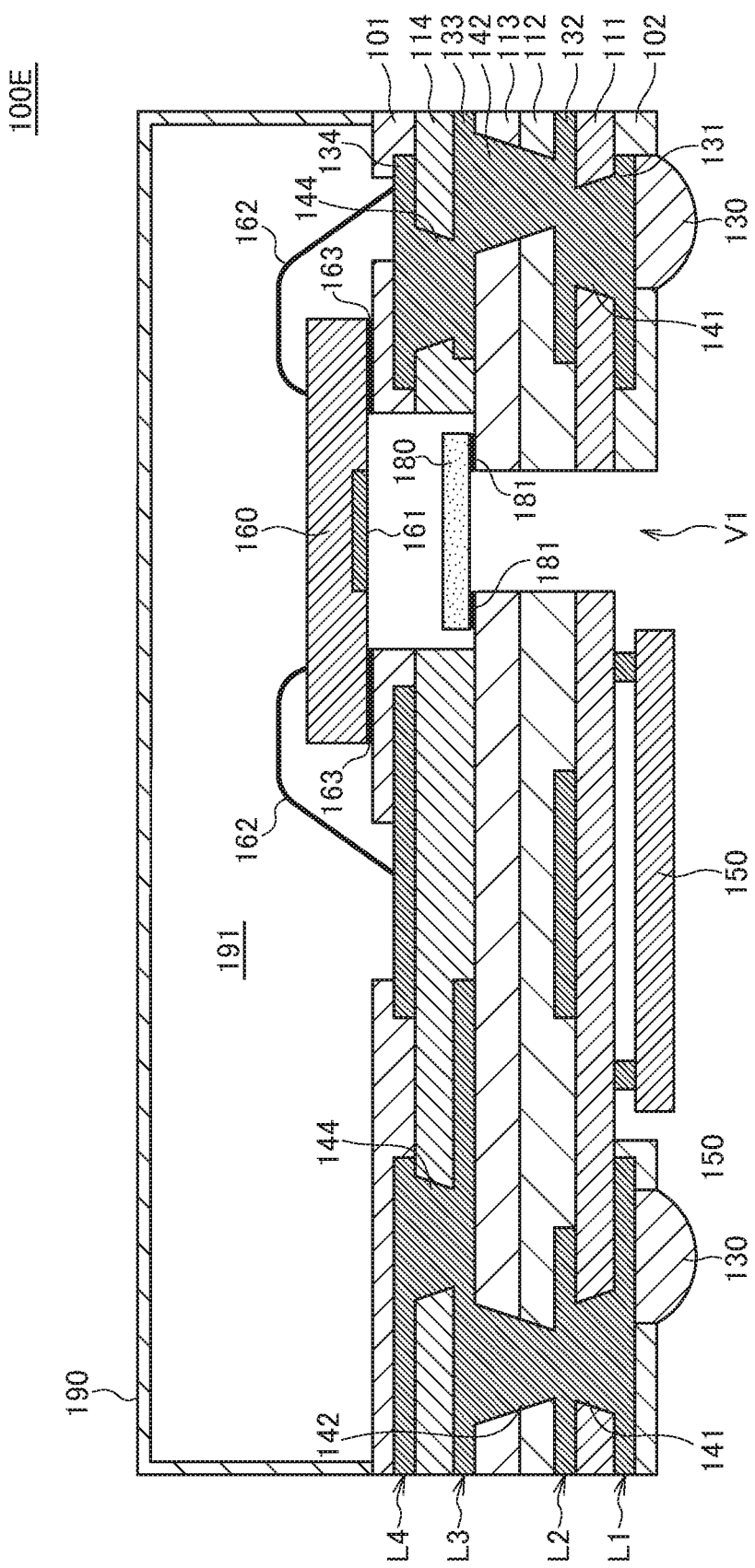
FIG. 26 is a schematic cross-sectional view for explaining the structure of a sensor module according to a fifth embodiment of the present invention.

FIG. 26 is a schematic cross-sectional view for explaining the structure of a sensor module 100E according to a fifth embodiment.

The sensor module 100E according to the fifth embodiment differs from the sensor module 100A according to the first embodiment in that the controller chip 150 is not embedded inside the substrate, but is mounted on the surface of the insulating layer 111 positioned in the lowermost layer. Other configurations are the same as those of the sensor module 100A according to the first embodiment, so the same reference numerals are given to the same elements, and overlapping description will be omitted. In the present embodiment as well, the controller chip 150 and the sensor chip 160 overlap each other in a plan view.

As the present embodiment illustrates, the controller chip 150 may not necessarily be embedded inside the substrate, and may be mounted on the surface of the substrate.

It is apparent that the present invention is not limited to the above embodiments, but may be modified and changed without departing from the scope and spirit of the invention.

What is claimed is:

1. A sensor package substrate comprising a first mounting area for mounting a sensor chip,
   wherein the sensor package substrate has a through hole formed at a position overlapping the first mounting area in a plan view so as to penetrate the sensor package substrate from one surface to other surface,
   wherein the through hole includes a first section having a first diameter and a second section having a second diameter smaller than the first diameter,
   wherein a step part inside the through hole positioned at a boundary between the first and second sections constitutes a second mounting area for mounting an anti-dust filter,
   wherein the sensor package substrate further comprises an electronic component embedded therein so as not to overlap the through hole,
   wherein the first section of the through hole is opened to the one surface so that the one surface of the sensor package substrate has a first opening having the first diameter,
   wherein the first mounting area is positioned on a side of the one surface, and wherein the second section of the through hole is opened to the other surface so that the other surface of the sensor package substrate has a second opening having the second diameter.

2. The sensor package substrate as claimed in claim 1, wherein at least one of the first and second sections of the through hole has a tapered shape in which a diameter thereof is continuously changed in a depth direction.

3. The sensor package substrate as claimed in claim 1, wherein the first section of the through hole is opened to the other surface, and
wherein the first mounting area is positioned on the side of the one surface.

4. The sensor package substrate as claimed in claim 1, wherein the through hole further includes a third section having a third diameter larger than the second diameter, and wherein the second section is positioned between the first and second sections.

5. The sensor package substrate as claimed in claim 4, wherein a step part inside the through hole positioned at the boundary between the second and third sections constitutes the first mounting area.

6. The sensor package substrate as claimed in claim 1, wherein the through hole further includes a third section having a third diameter larger than the first diameter, wherein the first section is positioned between the second and third sections, and
wherein a step part inside the through hole positioned at the boundary between the first and third sections constitutes the first mounting area.

7. The sensor package substrate as claimed in claim 1, wherein the first mounting area and the electronic component overlaps each other in a plan view.

8. The sensor package substrate as claimed in claim 1, wherein the electronic component comprises a semiconductor IC.

9. The sensor package substrate as claimed in claim 1, wherein the sensor package substrate comprises a plurality of insulating layers and a plurality of wiring layers, and
wherein the through hole is formed so as to penetrate the plurality of insulating layers and the plurality of wiring layers.

10. The sensor package substrate as claimed in claim 9, wherein a part of the wiring layers is exposed on an inner wall of the through hole.

11. A sensor module comprising:
a sensor package substrate having first and second mounting areas;
a sensor chip mounted on the first mounting area; and
an anti-dust filter mounted on the second mounting area, wherein the sensor package substrate has a through hole formed at a position overlapping the first mounting area in a plan view so as to penetrate the sensor package substrate from one surface to other surface,
wherein the through hole includes a first section having a first diameter and a second section having a second diameter smaller than the first diameter,
wherein a step part inside the through hole positioned at a boundary between the first and second sections constitutes the second mounting area,
wherein the sensor package substrate further has an electronic component embedded therein so as not to overlap the through hole,
wherein the first section of the through hole is opened to the one surface so that the one surface of the sensor package substrate has a first opening having the first diameter,
wherein the first mounting area is positioned on a side of the one surface, and
wherein the second section of the through hole is opened to the other surface so that the other surface of the sensor package substrate has a second opening having the second diameter.

12. The sensor module as claimed in claim 11, wherein the sensor chip is a sensor that detects air vibration, air pressure, air temperature or air composition.

13. The sensor module as claimed in claim 11, wherein the electronic component is embedded in the sensor package substrate so as not to overlap the anti-dust filter.

14. The sensor module as claimed in claim 13, wherein the electronic component overlaps the sensor chip.

15. An apparatus comprising:
a first insulating layer having a first through hole penetrating therethrough;
a second insulating layer having a second through hole penetrating therethrough; and
a plurality of wiring layers located on or embedded in the first and second insulating layers,
wherein the first and second insulating layers are stacked to each other so that the first and second through holes overlap each other,
wherein the first and second insulating layers have a same outer shape as each other,
wherein the first through hole is greater in diameter than the second through hole so that a part of a surface of the second insulating layer is exposed in a ring shaped at a boundary between the first and second through holes, and
wherein the plurality of wiring layers are removed at a position overlapping the first and second through holes so as not to clog the first and second through holes.

16. The apparatus as claimed in claim 15, wherein the first and second insulating layers are stacked to each other so as to form a single multilayer circuit substrate.

17. The apparatus as claimed in claim 16,
wherein the first insulating layer has a first surface,
wherein the second insulating layer has a second surface,
wherein the first and second insulating layers are stacked to each other such that the first and second surfaces are in contact with each other, and
wherein the first surface is completely covered with the second surface.

18. The apparatus as claimed in claim 15, further comprising an electronic component embedded in the first or second insulating layer so as not to overlap the first and second through holes.

* * * * *